(12) United States Patent
Chen et al.

(10) Patent No.: US 12,666,949 B2
(45) Date of Patent: Jun. 23, 2026

(54) CIRCUIT CELLS HAVING POWER STUBS

(71) Applicant: TAIWAN SEMICONDUCTOR MANUFACTURING COMPANY, LTD., Hsinchu (TW)

(72) Inventors: Yi-Yi Chen, Hsinchu (TW); Li-Chun Tien, Hsinchu (TW); Chih-Liang Chen, Hsinchu (TW); Wei-Cheng Lin, Hsinchu (TW); Jiann-Tyng Tzeng, Hsinchu (TW); Chi-Yu Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 381 days.

(21) Appl. No.: 18/341,329

(22) Filed: Jun. 26, 2023

(65) Prior Publication Data

US 2024/0429167 A1      Dec. 26, 2024

(51) Int. Cl.
| | |
|---|---|
| *H10W 20/41* | (2026.01) |
| *H10D 64/23* | (2025.01) |
| *H10D 84/01* | (2026.01) |
| *H10D 84/03* | (2025.01) |
| *H10D 84/85* | (2025.01) |
| *H10D 89/10* | (2025.01) |
| *H10W 20/42* | (2026.01) |

(52) U.S. Cl.
CPC ........ *H10W 20/427* (2026.01); *H10D 64/251* (2025.01); *H10D 84/0186* (2025.01); *H10D 84/0188* (2025.01); *H10D 84/038* (2025.01); *H10D 84/85* (2025.01); *H10W 20/42* (2026.01)

(58) Field of Classification Search
CPC .. H10D 89/10; H10D 64/251; H10D 84/0186; H10D 84/85; H10D 84/0149; H10D 84/851; H01L 23/5286; H01L 23/5226; H01L 25/0657; H01L 2224/16145; H01L 2224/32145
See application file for complete search history.

(56) References Cited

U.S. PATENT DOCUMENTS

| | | | |
|---|---|---|---|
| 2011/0121366 A1 | 5/2011 | Or-Bach et al. | |
| 2012/0248595 A1 | 10/2012 | Or-Bach et al. | |

FOREIGN PATENT DOCUMENTS

| | | |
|---|---|---|
| TW | 201830659 | 8/2018 |
| TW | 201842599 | 12/2018 |

*Primary Examiner* — Sonya McCall-Shepard
(74) *Attorney, Agent, or Firm* — Hauptman Ham, LLP

(57) ABSTRACT

An integrated circuit includes a first-type active-region structure and a second-type active-region structure extending in a first direction and a first terminal-conductor and a second terminal-conductor extending in a second direction. The integrated circuit also includes a first power stub and a second power stub in a first metal layer and a first power line and a second power line in a second metal layer. The integrated circuit further includes a first via connector directly connected between the first power stub and the first terminal-conductor, a second via connector directly connected between the second power stub and the second terminal-conductor, a third via connector directly connected between the first power stub and the first power line, and a fourth via connector directly connected between the second power stub and the second power line.

20 Claims, 24 Drawing Sheets

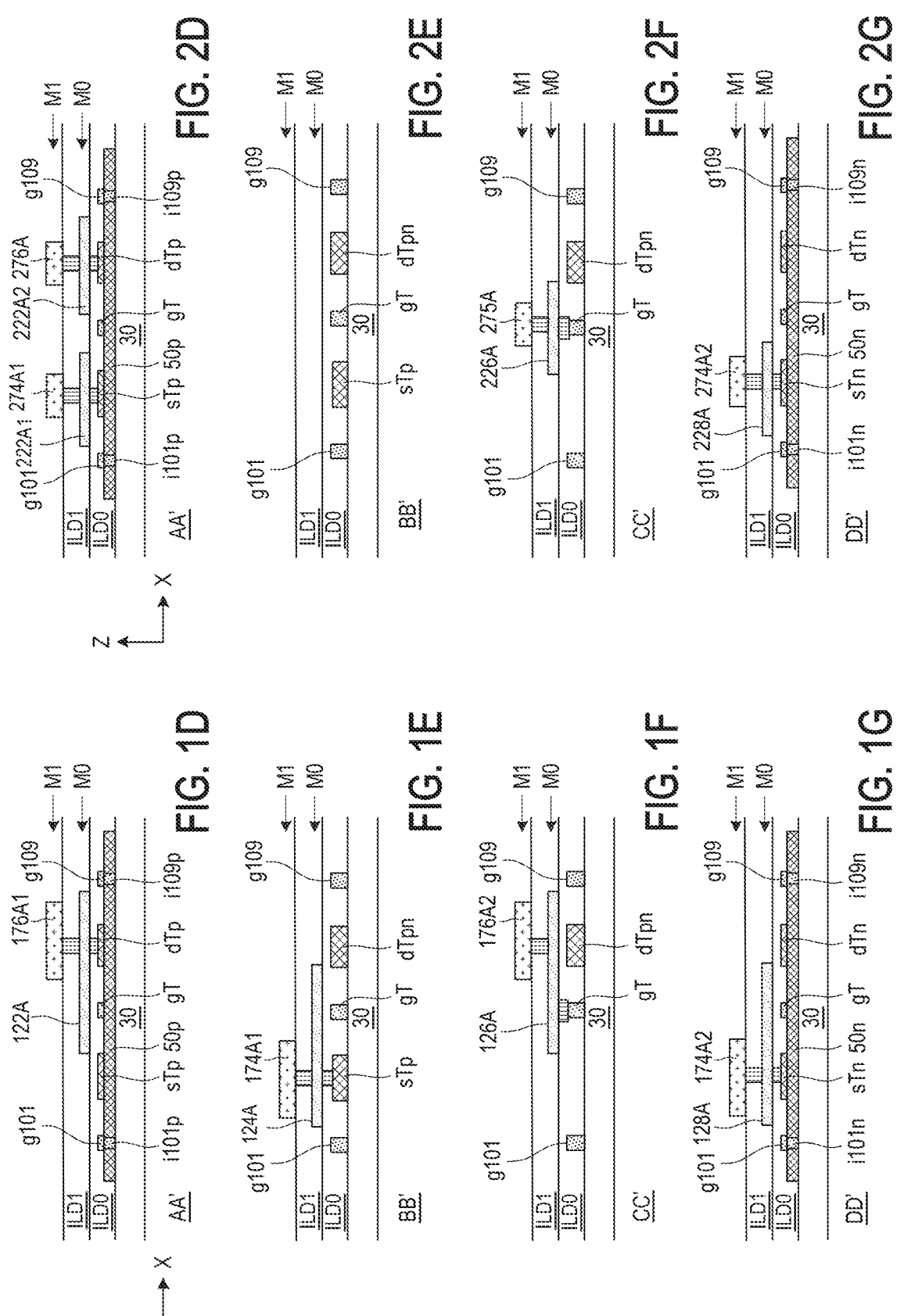

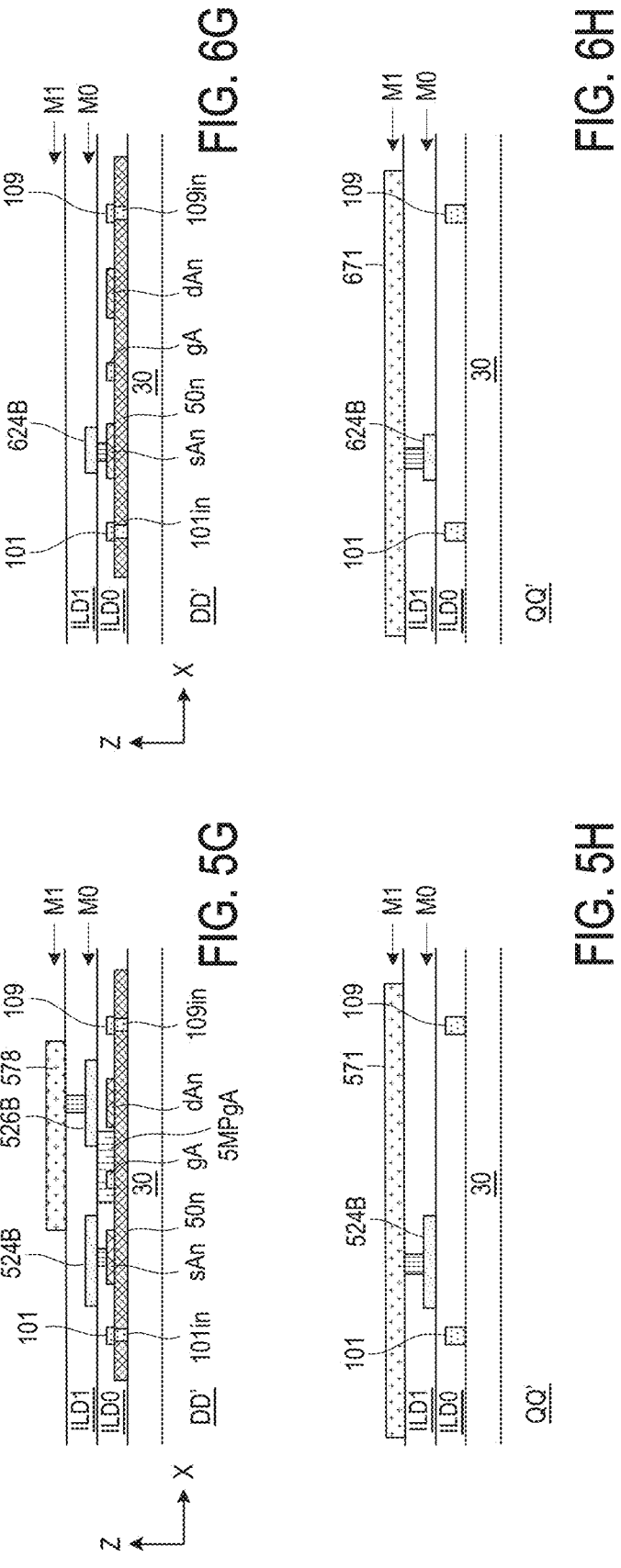

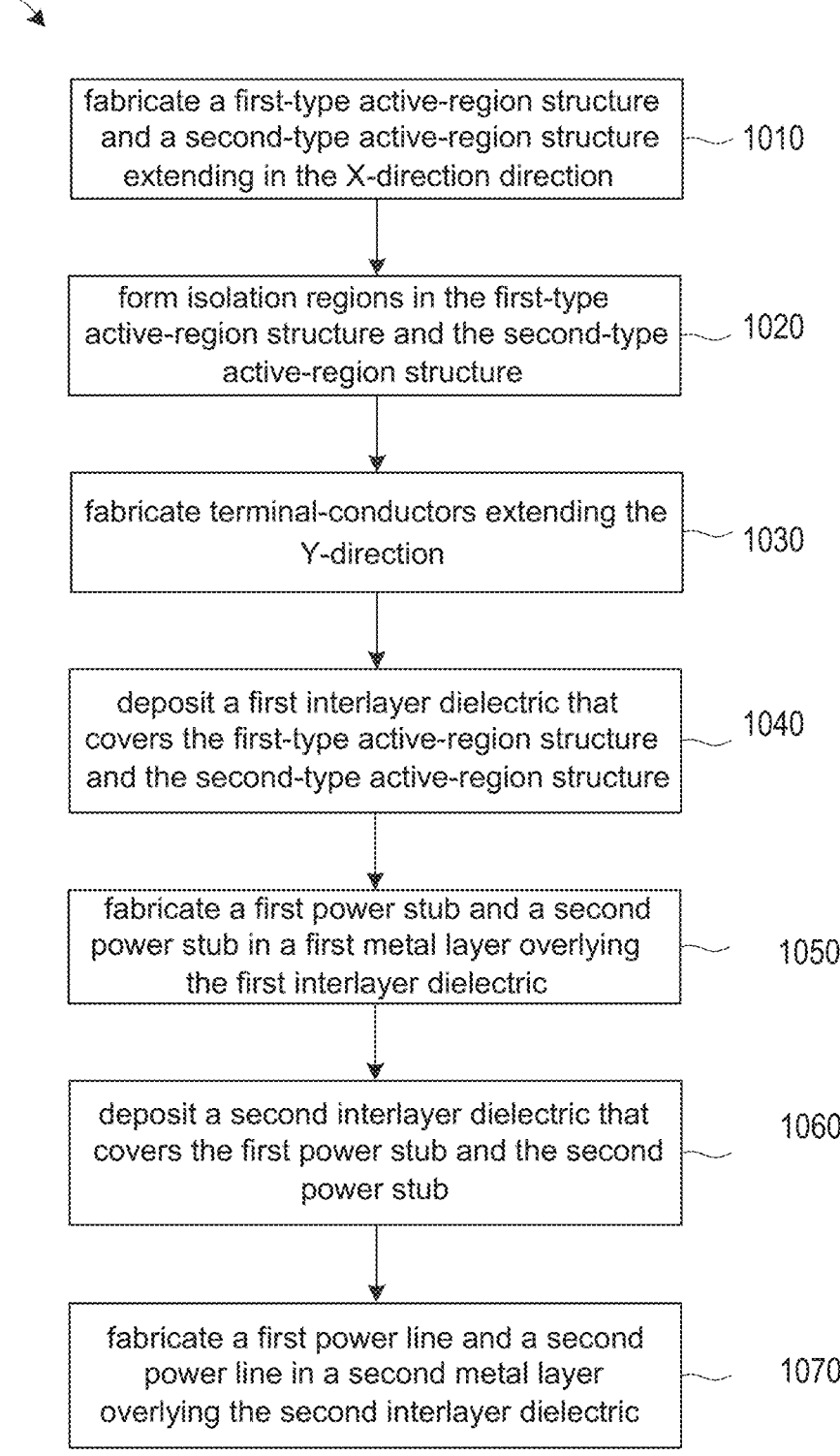

1000 fabricate a first-type active-region structure and a second-type active-region structure extending in the X-direction direction ⟶ 1010 form isolation regions in the first-type active-region structure and the second-type active-region structure ⟶ 1020 fabricate terminal-conductors extending the Y-direction ⟶ 1030 deposit a first interlayer dielectric that covers the first-type active-region structure and the second-type active-region structure ⟶ 1040 fabricate a first power stub and a second power stub in a first metal layer overlying the first interlayer dielectric ⟶ 1050 deposit a second interlayer dielectric that covers the first power stub and the second power stub ⟶ 1060 fabricate a first power line and a second power line in a second metal layer overlying the second interlayer dielectric ⟶ 1070

FIG. 10

CIRCUIT CELLS HAVING POWER STUBS

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1D-1G are cross-sectional views of circuit cells, in accordance with some embodiments.

FIGS. 2D-2G are cross-sectional views of circuit cells, in accordance with some embodiments.

FIGS. 5D-5H are cross-sectional views of circuit cells, in accordance with some embodiments.

FIGS. 6D-6H are cross-sectional views of circuit cells, in accordance with some embodiments.

FIG. 10 is a flowchart of a method of manufacturing an integrated circuit having power stubs, in accordance with some embodiments.

DETAILED DESCRIPTION

Figure 2A:
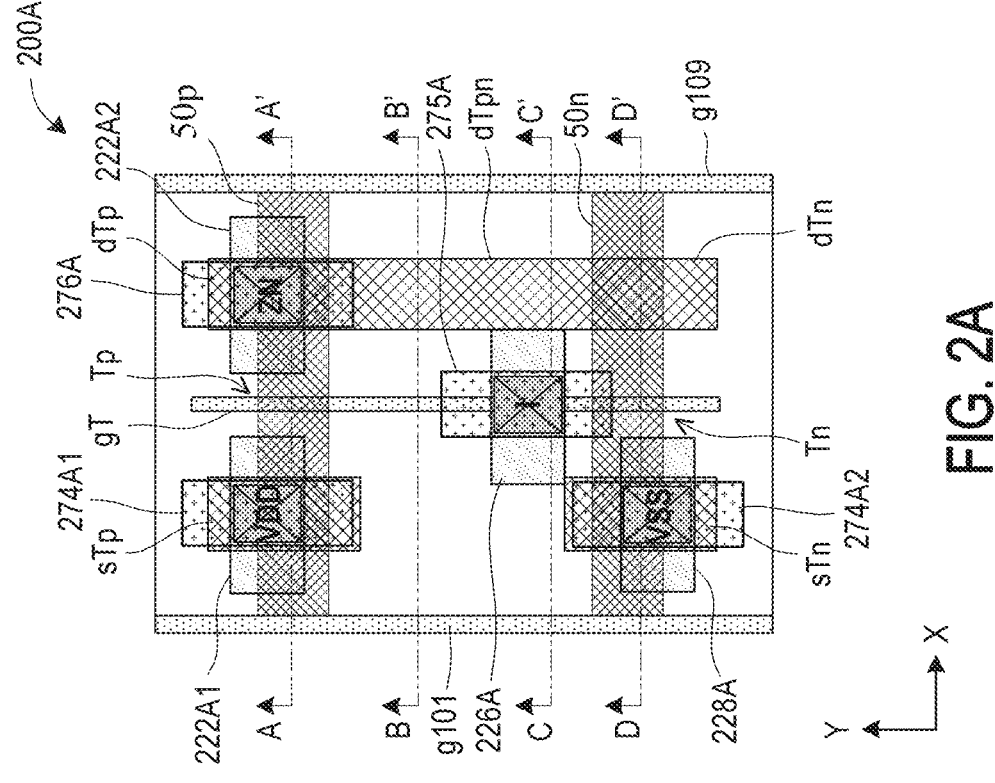
FIGS. 2A-2C are layout diagrams of circuit cells, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, an integrated circuit having a circuit cell. The circuit cell includes power stubs in a first metal layer (e.g., a metal layer M0) overlying the interlayer dielectric that covers the gate-conductors of the transistors. The integrated circuit also includes power lines in a second metal layer (e.g., a metal layer M1). The power supply voltages are applied to the circuit cell through the power lines and the power stubs. In some embodiments, when a power stub extends in a direction that is perpendicular to the gate-conductors, the length of the power stub is smaller than the width of the circuit cell. In some embodiments, when a power stub extends in a direction that is parallel to the gate-conductors, the length of the power stub is smaller than the height of the circuit cell. In some embodiments, a circuit cell implemented with the power stubs in a first metal layer has a smaller cell height than some alternative implementations in which power rails in the first metal layer extend across multiple circuit cells in a row.

Figure 1A:
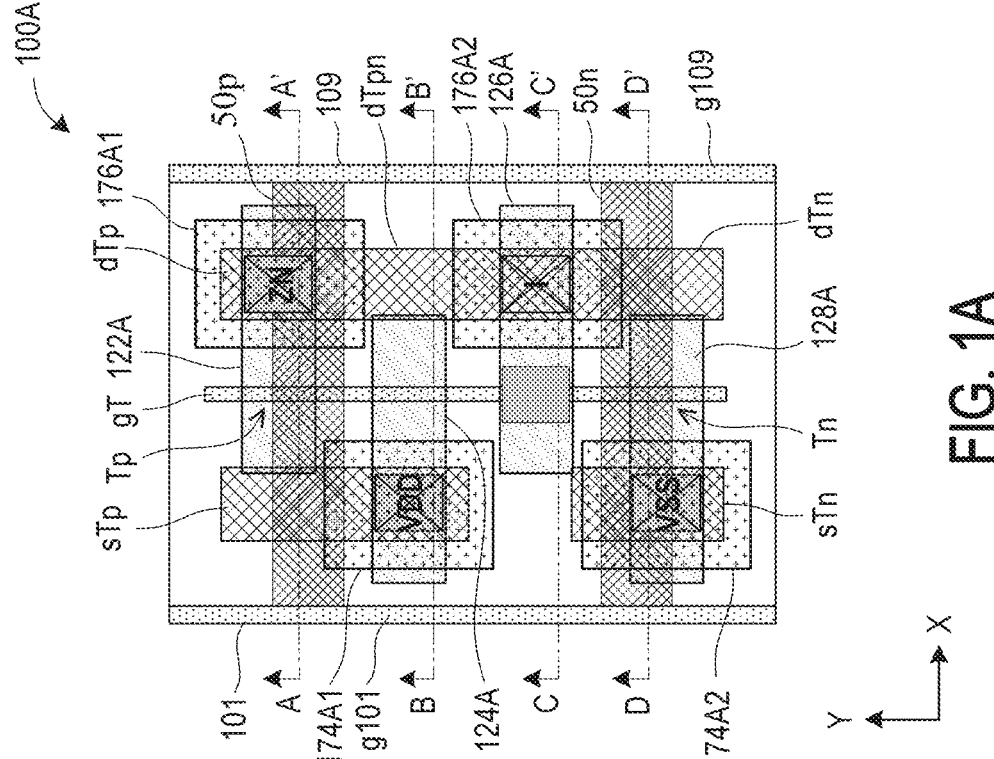
FIGS. 1A-1C are layout diagrams of circuit cells, in accordance with some embodiments.
Figures 1B, 2B:
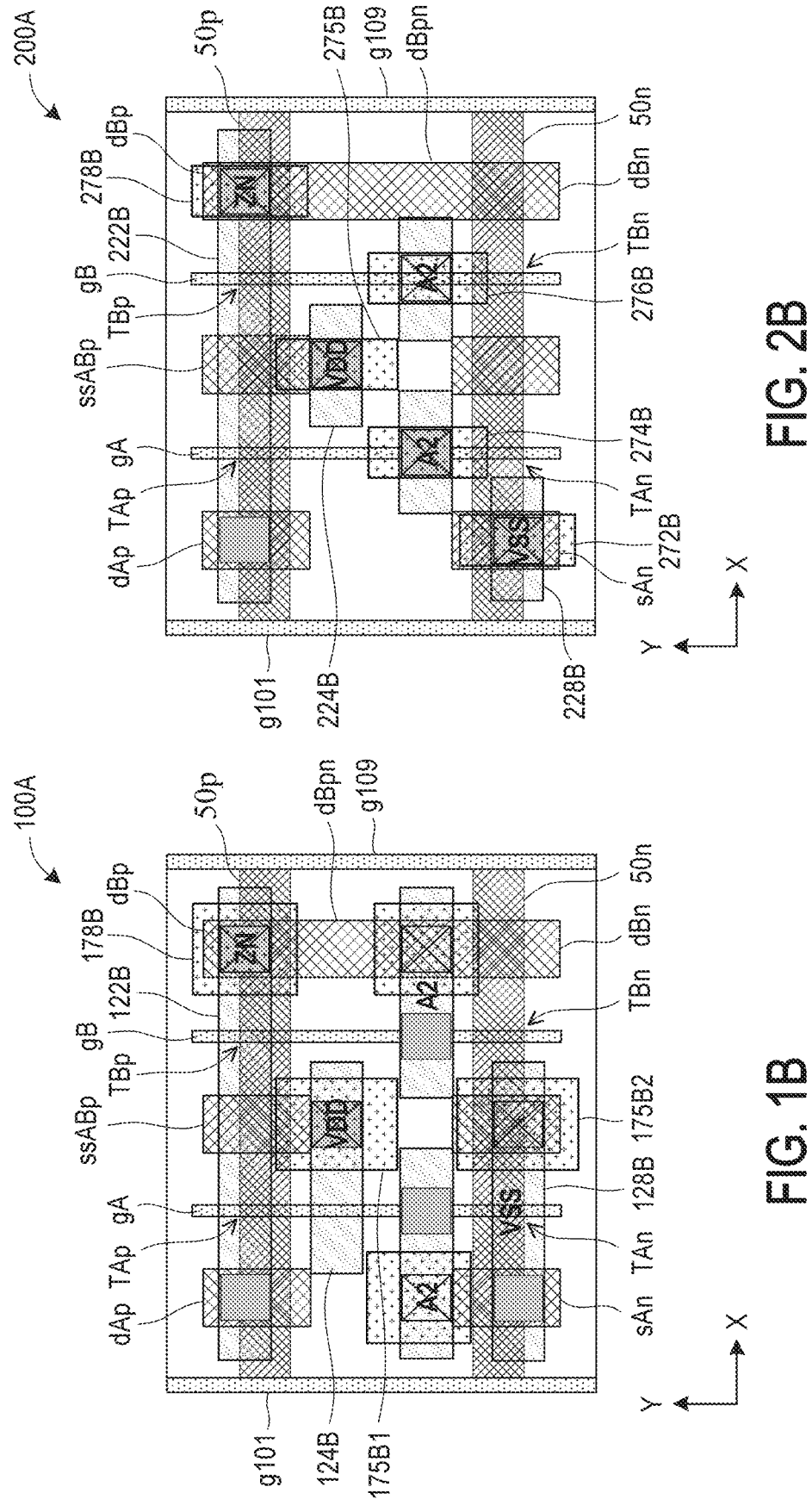
Figure 1C:
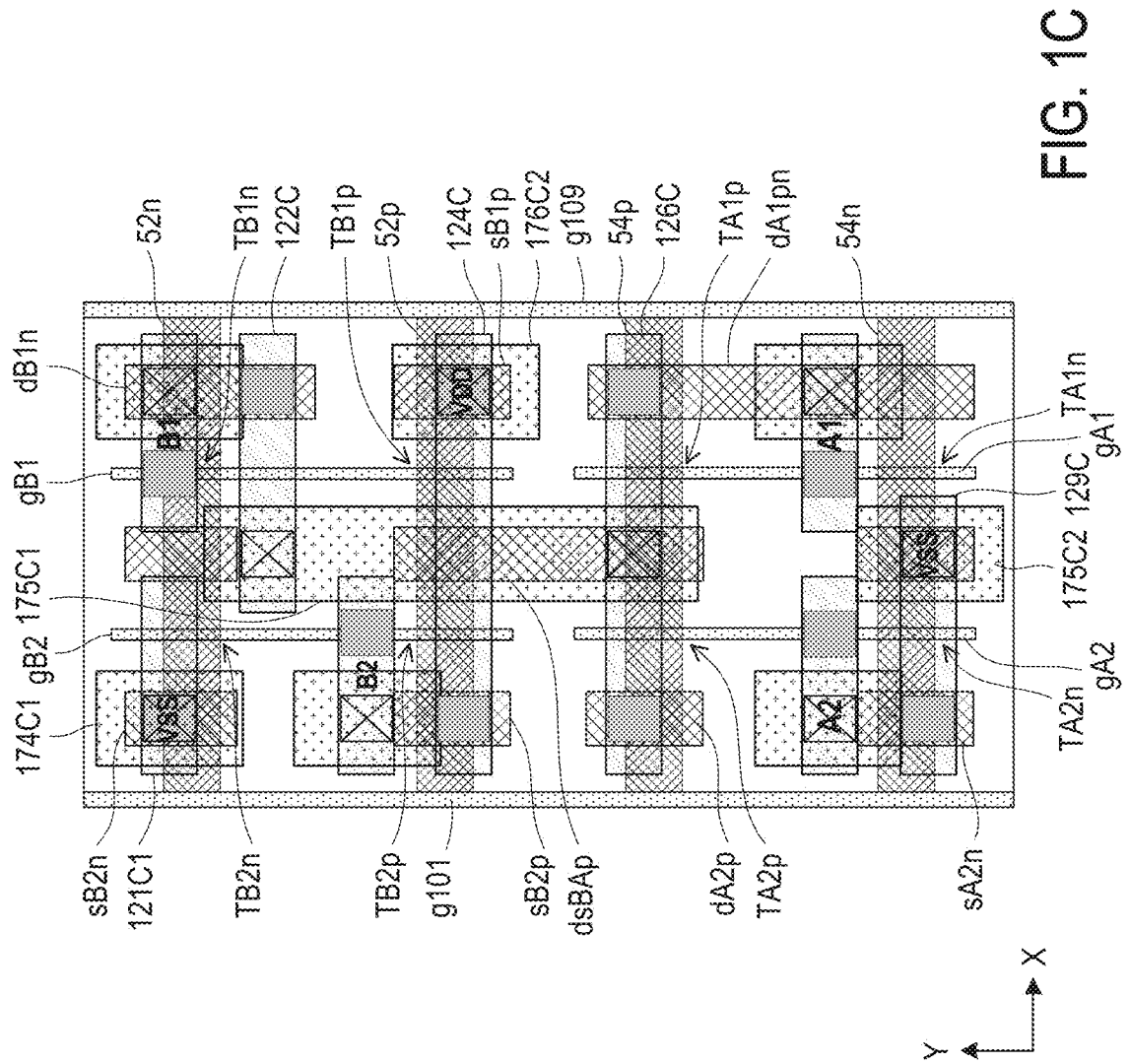
Figure 2C:
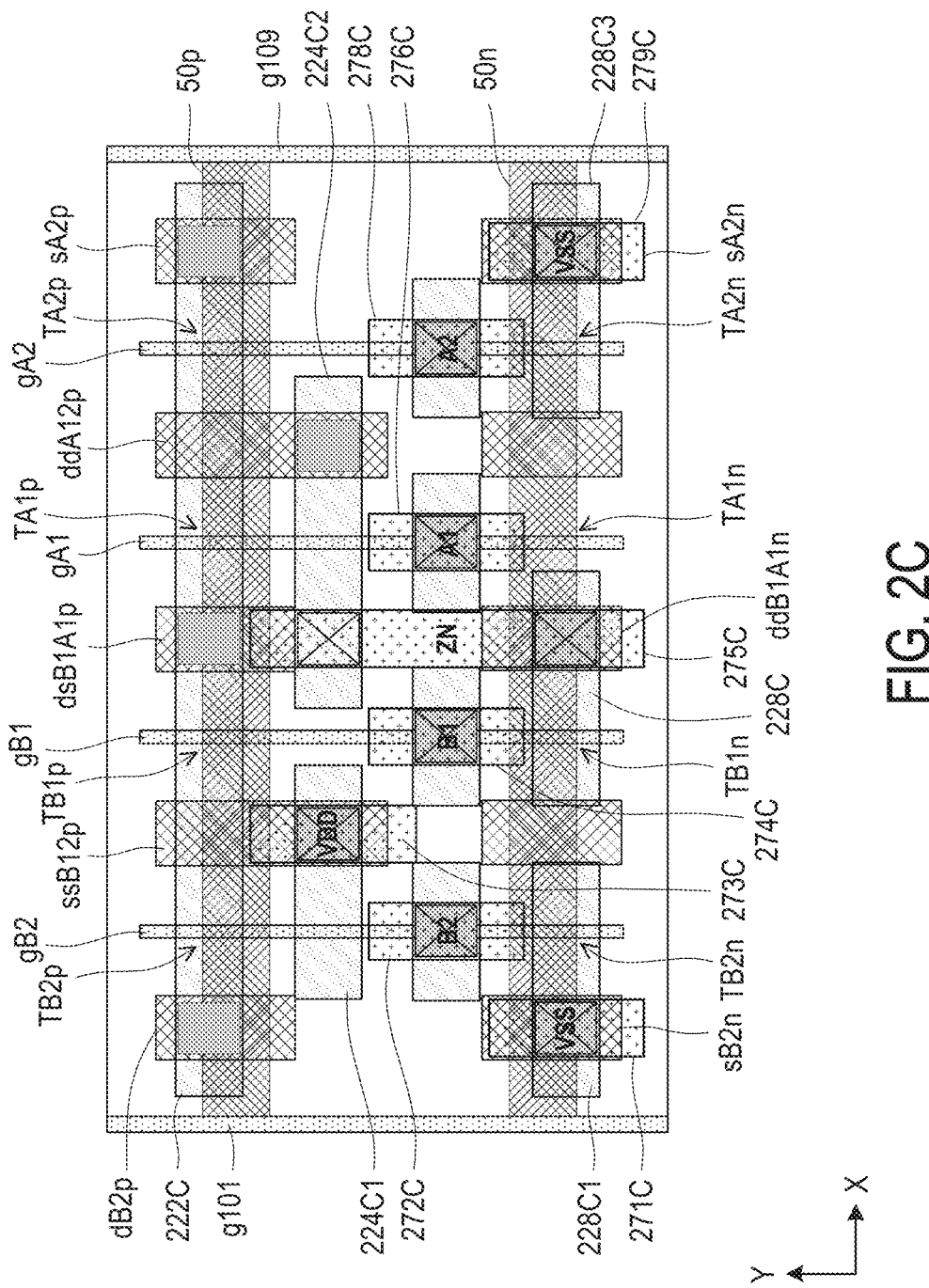

FIG. 1A and FIG. 2A are layout diagrams of circuit cells 100A and 200A each implemented with an inverter, in accordance with some embodiments. FIG. 1B and FIG. 2B are layout diagrams of circuit cells 100B and 200B each implemented with a NAND gate, in accordance with some embodiments. FIG. 1C and FIG. 2C are layout diagrams of circuit cells 100C and 200C each implemented with an AOI gate (i.e., an AND-OR-Inverter), in accordance with some embodiments.

In FIG. 1A and FIG. 2A, each of the circuit cells 100A and 200A includes a PMOS active-region structure 50p and an NMOS active-region structure 50n extending in the X-direction. Each of the circuit cells 100A and 200A includes a gate-conductor gT extending in the Y-direction. Each of the circuit cells 100A and 200A also includes the dummy gate-conductors g101 and g109 at the vertical cell boundaries of the circuit cells. The gate-conductor gT is separated from each of the dummy gate-conductors g101 and g109 by a pitch distance of one Contacted Poly Pitch ("CPP"). Here, the Y-direction is perpendicular to the X-direction. The gate-conductor gT intersects the PMOS active-region structure 50p at the channel region of the PMOS transistor Tp and intersects the NMOS active-region structure 50n at the channel region of the NMOS transistor Tn.

In some embodiments, each of the p-type active-region semiconductor structure 50*p* and the n-type active-region semiconductor structure 50*n* includes one or more fin structures, and consequently, each of the PMOS transistor Tp and the NMOS transistor Tn is a finFET transistor. In some embodiments, each of the p-type active-region semiconductor structure 50*p* and the n-type active-region semiconductor structure 50*n* includes one or more nano-sheets, and consequently, each of the PMOS transistor Tp and the NMOS transistor Tn is a nano-sheet transistor. In some embodiments, each of the p-type active-region semiconductor structure 50*p* and the n-type active-region semiconductor structure 50*n* includes one or more nano-wires, and consequently, each of the PMOS transistor Tp and the NMOS transistor Tn is a nano-wire transistor.

Each of the circuit cells 100A and 200A also includes terminal-conductors (such as, sTp, sTn, and dTpn) intersecting the PMOS active-region structure 50*p* or the NMOS active-region structure 50*n* at various source regions or drain regions of the transistors. The source terminal sTp of the PMOS transistor Tp is configured to receive the upper power supply voltage VDD, and the source terminal sTn of the NMOS transistor Tn is configured to receive the lower power supply voltage VSS. The terminal-conductor dTpn connects the drain terminal dTp of the PMOS transistor Tp with the drain terminal dTn of the NMOS transistor Tn. The gate terminal of the PMOS transistor Tp and the gate terminal of the NMOS transistor Tn are conductively connected through the gate-conductor gT. The gate-conductor gT is configured to carry an input signal "I" of the inverter, and the terminal-conductor dTpn is configured to carry an output signal "Z" of the inverter.

In FIG. 1A, the circuit cell 100A includes horizontal conducting lines 122A, 124A, 126A, and 128A extending in the X-direction in a first metal layer (e.g., a metal layer M0). The circuit cell 100A also includes vertical conducting lines 174A1, 174A2, 176A1, and 176A2 extending in the Y-direction in a second metal layer (e.g., a metal layer M1). Each of the vertical conducting lines is aligned with a vertical routing track. Two adjacent vertical routing tracks are separated by a pitch distance of one CPP. The cross-sectional views of the circuit cell 100A are shown in FIGS. 1D-1G.

FIG. 1D is a cross-sectional view of the circuit cell 100A along the cutting plane AA' as shown in FIG. 1A, in accordance with some embodiments. FIG. 1E is a cross-sectional view of the circuit cell 100A along the cutting plane BB' as shown in FIG. 1A, in accordance with some embodiments. FIG. IF is a cross-sectional view of the circuit cell 100A along the cutting plane CC' as shown in FIG. 1A, in accordance with some embodiments. FIG. 1G is a cross-sectional view of the circuit cell 100A along the cutting plane DD' as shown in FIG. 1A, in accordance with some embodiments.

As shown in FIGS. 1D-1G, the horizontal conducting lines 122A, 124A, 126A, and 128A are fabricated in a first metal layer (e.g., a metal layer M0) overlying a first interlayer dielectric ILD0 that covers the PMOS active-region structure 50*p*, the NMOS active-region structure 50*n*, the gate-conductor gT, and various terminal-conductors. The vertical conducting lines 174A1, 174A2, 176A1, and 176A2 are fabricated in a second metal layer (e.g., a metal layer M1) overlying a second interlayer dielectric ILD1 that covers the horizontal conducting lines in the first metal layer.

Additionally, the gate-conductor gT is connected to the vertical conducting line 176A2 through the horizontal conducting lines 126A, while the vertical conducting line 176A2 is configured as an input pin for the inverter in the circuit cell 100A. The terminal-conductor dTp is connected to the vertical conducting line 176A1 through the horizontal conducting lines 122A, while the vertical conducting line 176A1 is configured as an output pin for the inverter in the circuit cell 100A.

In FIG. 1A and FIGS. 1D-1G, the source terminal sTp of the PMOS transistor Tp is directly connected to the horizontal conducting line 124A with a via connector VD, and the horizontal conducting line 124A is directly connected to the vertical conducting line 174A1 with a via connector V0. The vertical conducting line 174A1 is configured to receive the upper power supply voltage VDD. The source terminal sTn of the NMOS transistor Tn is directly connected to the horizontal conducting line 128A with a via connector VD, and the horizontal conducting line 124A is directly connected to the vertical conducting line 174A2 with a via connector V0. The vertical conducting line 174A2 is configured to receive the lower power supply voltage VSS.

In FIG. 1A and FIGS. 1D-1G, each of the horizontal conducting lines 124A and 128A functions as a power stub, and each of the vertical conducting lines 172A1 and 174A2 functions as a power line. In some embodiments, when a power stub extends in the X-direction, the length of the power stub is smaller than the width of the circuit cell, and the power stub is bounded between the dummy gate-conductors g101 and g109. Here, the width of the circuit cell 100A is the pitch distance between the dummy gate-conductors g101 and g109. In some embodiments, when a power line extends in the Y-direction, the length of the power stub is smaller than the height of the circuit cell. In some alternative embodiments, when a power line extends in the Y-direction, the length of the power stub is larger than or equal to the height of the circuit cell.

In FIG. 2A, the circuit cell 200A includes horizontal conducting lines 222A1, 222A2, 226A, and 228A extending in the X-direction in a first metal layer (e.g., a metal layer M0). The circuit cell 200A also includes vertical conducting lines 274A1, 274A2, 275A, and 276A extending in the Y-direction in a second metal layer (e.g., a metal layer M1). Each of the vertical conducting lines is aligned with a vertical routing track. Two adjacent vertical routing tracks are separated by a pitch distance of 0.5 CPP. The cross-sectional views of the circuit cell 200A are shown in FIGS. 2D-2G.

FIG. 2D is a cross-sectional view of the circuit cell 200A along the cutting plane AA' as shown in FIG. 2A, in accordance with some embodiments. FIG. 2E is a cross-sectional view of the circuit cell 200A along the cutting plane BB' as shown in FIG. 2A, in accordance with some embodiments. FIG. 2F is a cross-sectional view of the circuit cell 200A along the cutting plane CC' as shown in FIG. 2A, in accordance with some embodiments. FIG. 2G is a cross-sectional view of the circuit cell 200A along the cutting plane DD' as shown in FIG. 2A, in accordance with some embodiments.

As shown in FIGS. 2D-2G, the horizontal conducting lines 222A, 226A, and 228A are fabricated in a first metal layer (e.g., a metal layer M0) overlying a first interlayer dielectric ILD0 that covers the PMOS active-region structure 50*p*, the NMOS active-region structure 50*n*, the gate-conductor gT, and various terminal-conductors. The vertical conducting lines 274A1, 274A2, 275A, and 276A are fabricated in a second metal layer (e.g., a metal layer M1) overlying a second interlayer dielectric ILD1 that covers the horizontal conducting lines in the first metal layer.

In FIG. 2A and FIGS. 2D-2G, the source terminal sTp of the PMOS transistor Tp is directly connected to the horizontal conducting line 222A1 with a via connector VD, and the horizontal conducting line 222A1 is directly connected to the vertical conducting line 274A1 with a via connector V0. The vertical conducting line 274A1 is configured to receive the upper power supply voltage VDD. The source terminal sTn of the NMOS transistor Tn is directly connected to the horizontal conducting line 228A with a via connector VD, and the horizontal conducting line 228A is directly connected to the vertical conducting line 274A2 with a via connector V0. The vertical conducting line 274A2 is configured to receive the lower power supply voltage VSS. In FIG. 2A and FIGS. 2D-2G, each of the horizontal conducting lines 222A1 and 228A functions as a power stub, and each of the vertical conducting lines 274A1 and 274A2 functions as a power line.

Additionally, in FIG. 2A and FIGS. 2D-2G, the gate-conductor gT is connected to the vertical conducting line 275A through the horizontal conducting lines 226A, while the vertical conducting line 275A is configured as an input pin for the inverter in the circuit cell 200A. The terminal-conductor dTp is connected to the vertical conducting line 276A through the horizontal conducting lines 222A2, while the vertical conducting line 276A is configured as an output pin for the inverter in the circuit cell 200A.

In FIG. 1A and FIG. 2A, each of the circuit cell 100A and the circuit cell 200A is between a first vertical cell boundary aligned with the dummy gate-conductor g101 and a second vertical cell boundary aligned with the dummy gate-conductor g109. In FIGS. 1D-1G and FIGS. 2D-2G, a boundary isolation region i101$p$ underneath the dummy gate-conductor g101 and a boundary isolation region i101$n$ in 50$n$ underneath the dummy gate-conductor g109 delineate the first vertical cell boundary extending in the Y-direction. A boundary isolation region i109$p$ underneath the dummy gate-conductor g101 and a boundary isolation region i109$n$ underneath the dummy gate-conductor g109 delineate the second vertical cell boundary extending in the Y-direction. The boundary isolation region i101$p$ and the boundary isolation region i109$p$ in the PMOS active-region structure 50$p$ isolate the source and the drain regions of the PMOS transistor Tp from the source and the drain regions of other PMOS transistors in the neighboring circuit cells. The boundary isolation region i101$n$ and the boundary isolation region i109$n$ in the NMOS active-region structure 50$n$ isolate the source and the drain regions of the NMOS transistor Tn from the source and the drain regions of other NMOS transistors in the neighboring circuit cells.

In some other embodiments, a circuit cell is implemented as a NAND gate. In FIG. 1B and FIG. 2B, each of the circuit cells 100B and 200B includes a PMOS active-region structure 50$p$ and an NMOS active-region structure 50$n$ extending in the X-direction. Each of the circuit cells 100B and 200B includes gate-conductors gA and gB extending in the Y-direction. Each of the circuit cells 100B and 200B also includes the dummy gate-conductors g101 and g109 at the vertical cell boundaries of the circuit cells. The gate-conductor gA intersects the PMOS active-region structure 50$p$ at the channel region of the PMOS transistor TAp and intersects the NMOS active-region structure 50$n$ at the channel region of the NMOS transistor TAn. The gate-conductor gB intersects the PMOS active-region structure 50$p$ at the channel region of the PMOS transistor TBp and intersects the NMOS active-region structure 50$n$ at the channel region of the NMOS transistor TBn.

Each of the circuit cells 100B and 200B also includes terminal-conductors (such as, dAp, ssABp, dBp, sAn, and dBn) intersecting the PMOS active-region structure 50$p$ or the NMOS active-region structure 50$n$ at various source regions or drain regions of the transistors. The joint source terminal ssABp of the PMOS transistors TAp and TBp is configured to receive the upper power supply voltage VDD, and the source terminal sAn of the NMOS transistor TAn is configured to receive the lower power supply voltage VSS. The drain terminal dAp of the PMOS transistor TAp and the drain terminal dBp of the PMOS transistor TBp are conductively connected together through a horizontal conducting line. The drain terminal dBp of the PMOS transistor TBp and the drain terminal dBn of the NMOS transistor TBn are conductively connected through the terminal-conductor dBpn. The source terminal of the NMOS transistor TBn and the drain terminal of the NMOS transistor TAn are jointed together in the NMOS active-region structure 50$n$.

In FIG. 1B, the circuit cell 100B includes horizontal conducting lines 122B, 124B, and 128B extending in the X-direction in a first metal layer (e.g., a metal layer M0). The circuit cell 100B also includes vertical conducting lines 175B1, 175B2, and 178B extending in the Y-direction in a second metal layer (e.g., a metal layer M1). Each of the vertical conducting lines is aligned with a vertical routing track. Two adjacent vertical routing tracks are separated by a pitch distance of one CPP. The joint source terminal ssABp of the PMOS transistors TAp and TBp is connected to the vertical conducting line 175B1 through the horizontal conducting lines 124B, while the vertical conducting line 175B1 is configured to receive the upper power supply voltage VDD. The source terminal sAn of the NMOS transistor TAn is connected to the vertical conducting line 175B2 through the horizontal conducting lines 128B, while the vertical conducting line 175B2 is configured to receive the lower power supply voltage VSS. In FIG. 1B, each of the horizontal conducting lines 124B and 128B functions as a power stub, and each of the vertical conducting lines 175B1 and 175B2 functions as a power line.

Additionally, in FIG. 1B, the drain terminal dAp of the PMOS transistor TAp and the drain terminal dBp of the PMOS transistor TBn are conductively connected through the horizontal conducting lines 122B, while the horizontal conducting lines 122B is connected to the vertical conducting line 178B which is configured as an output pin for the NAND gate in the circuit cell 100B.

In FIG. 2B, the circuit cell 200B includes horizontal conducting lines 222B, 224B, and 228B extending in the X-direction a first metal layer (e.g., a metal layer M0). The circuit cell 200B also includes vertical conducting lines 272B, 274B, 275B, 276B, and 278B extending in the Y-direction in a second metal layer (e.g., a metal layer M1). Each of the vertical conducting lines is aligned with a vertical routing track. Two adjacent vertical routing tracks are separated by a pitch distance of 0.5 CPP. The joint source terminal ssABp of the PMOS transistors TAp and TBp is connected to the vertical conducting line 275B through the horizontal conducting lines 224B, while the vertical conducting line 275B is configured to receive the upper power supply voltage VDD. The source terminal sAn of the NMOS transistor TAn is connected to the vertical conducting line 272B through the horizontal conducting lines 228B, while the vertical conducting line 272B is configured to receive the lower power supply voltage VSS. In FIG. 1B, each of the horizontal conducting lines 224B and 228B functions as a power stub, and each of the vertical conducting lines 275B and 272B functions as a power line.

Additionally, in FIG. 1B, the drain terminal dAp of the PMOS transistor TAp and the drain terminal dBp of the PMOS transistor TBn are conductively connected together through the horizontal conducting lines 222B, while the horizontal conducting lines 222B is connected to the vertical conducting line 278B which is configured as an output pin for the NAND gate in the circuit cell 200B. The gate-conductors gA and gB are correspondingly connected to the vertical conducting lines 274B and 276B, which are configured as the input pins for the NAND gate in the circuit cell 200B.

In some other embodiments, a circuit cell is implemented as an AOI gate. In FIG. 1C, the circuit cell 100C includes PMOS active-region structures 52$p$ and 54$p$ extending in the X-direction and includes NMOS active-region structure 52$n$ and 54$n$ extending in the X-direction. The circuit cell 100C includes gate-conductors gA1, gA2, gB1, and gB2 extending in the Y-direction. The circuit cell 100C also includes the dummy gate-conductors g101 and g109 at the vertical cell boundaries of the circuit cells. The gate-conductors gA1 and gA2 intersect the PMOS active-region structure 54$p$ correspondingly at the channel regions of the PMOS transistors TA1$p$ and TA2$p$. The gate-conductors gA1 and gA2 also intersect the NMOS active-region structure 54$n$ correspondingly at the channel regions of the NMOS transistors TA1$n$ and TA2$n$. The gate-conductors gB1 and gB2 intersect the PMOS active-region structure 52$p$ correspondingly at the channel regions of the PMOS transistors TB1$p$ and TB2$p$. The gate-conductors gB1 and gB2 also intersect the NMOS active-region structure 52$n$ correspondingly at the channel regions of the NMOS transistors TB1$n$ and TB2$n$.

In FIG. 1C, the circuit cell 100C includes terminal-conductors (such as, sB2$p$, sB1$p$, dA2$p$, dsBAp, and dA1$pn$) intersecting one of the PMOS active-region structures 52$p$ or 54$p$ at various source regions or drain regions of the PMOS transistors. The circuit cell 100C includes terminal-conductors (such as, sB2$n$, dB1$n$, sA2$n$, and dA1$pn$,) intersecting one of the NMOS active-region structures 52$n$ or 54$n$ at various source regions or drain regions of the NMOS transistors. The circuit cell 100C includes horizontal conducting lines 121C1, 122C, 124C, 126C, and 129C extending in the X-direction in a first metal layer (e.g., a metal layer M0). The circuit cell 100C includes vertical conducting lines 174C1, 175C1, 175C2, and 176C2 extending in the Y-direction in a second metal layer (e.g., a metal layer M1). Each of the vertical conducting lines is aligned with a vertical routing track. Two adjacent vertical routing tracks are separated by a pitch distance of one CPP.

In FIG. 1C, each of the source terminal sB1$p$ of the PMOS transistors TB1$p$ and the source terminal sB2$p$ of the PMOS transistors TB2$p$ is configured to receive the upper power supply voltage VDD. Each of the source terminal sB2$n$ of the NMOS transistor TB2$n$ and the source terminal sA2$n$ of the NMOS transistor TA2$n$ is configured to receive the lower power supply voltage VSS. The gate-conductors gA1, gA2, gB1, and gB2 are correspondingly configured to receive the input signal "A1", the input signal "A2", the input signal "B1", and the input signal "B2" of the AOI gate in the circuit cell 100C. The vertical conducting line 175C1 is configured to carry the output signal "ZN" of the AOI gate.

In FIG. 1C, the source terminal sB1$p$ of the PMOS transistors TB1$p$ and the source terminal sB2$p$ of the PMOS transistors TB2$p$ is connected to the vertical conducting line 176C2 through the horizontal conducting line 124C, while the vertical conducting line 176C2 is configured to receive the upper power supply voltage VDD. The joint terminal dsBAp connects the drain terminals of the PMOS transistors TB1$p$ and TB2$p$ with the source terminals of the PMOS transistors TA1$p$ and TA2$p$. The drain terminal dA2$p$ of the PMOS transistor TA2$p$ is connected to the drain terminal of the PMOS transistor TA1$p$ through the horizontal conducting line 126C, while the drain terminal of the PMOS transistor TA1$p$ is connected to the drain terminal of the NMOS transistor TA1$n$ through the joint terminal dA1$pn$. The source terminal of the NMOS transistor TB1$n$ and the drain terminal of the NMOS transistor TB2$n$ are jointed together in the NMOS active-region structure 54$n$. The source terminal sA2$n$ of the NMOS transistor TA2$n$ is connected to the vertical conducting line 175C2 through the horizontal conducting lines 129C, while the vertical conducting line 175C2 is configured to receive the lower power supply voltage VSS.

In FIG. 1C, the horizontal conducting line 126C is also connected to the horizontal conducting line 122C through the vertical conducting line 175C1, while the horizontal conducting line 122C is connected to the drain terminal dB1$n$ of the NMOS transistor TB1$n$. The source terminal of the NMOS transistor TB1$n$ and the drain terminal of the NMOS transistor TB2$n$ are jointed together in the NMOS active-region structure 52$n$. The source terminal sB2$n$ of the NMOS transistor TB2$n$ is connected to the vertical conducting line 174C1 through the horizontal conducting lines 121C1, while the vertical conducting line 174C1 is configured to receive the lower power supply voltage VSS.

In FIG. 1C, each of the horizontal conducting lines 124C, 129C, and 121C1 functions as a power stub, and each of the vertical conducting lines, 176C2, 175C2, and 174C1 functions as a power line. In some embodiments, when a power stub extends in the X-direction, the length of the power stub is smaller than the width of the circuit cell, and the power stub is bounded between the dummy gate-conductors g101 and g109.

In some other embodiments, a circuit cell is implemented as an AOI gate. In FIG. 2C, the circuit cell 200C includes a PMOS active-region structure 50$p$ and an NMOS active-region structure 50$n$ extending in the X-direction. The circuit cell 200C includes gate-conductors gA1, gA2, gB1, and gB2 extending in the Y-direction. The circuit cell 200C also includes the dummy gate-conductors g101 and g109 at the vertical cell boundaries of the circuit cells. The gate-conductors gA1, gA2, gB1, and gB2 intersect the PMOS active-region structure 50$p$ correspondingly at the channel regions of the PMOS transistors TA1$p$, TA2$p$, TB1$p$, and TB2$p$. The gate-conductors gA1, gA2, gB1, and gB2 intersect the NMOS active-region structure 50$n$ correspondingly at the channel regions of the NMOS transistors TA1$n$, TA2$n$, TB1$n$, and TB2$n$.

In FIG. 2C, the circuit cell 200C includes terminal-conductors (such as, dB2$p$, ssB12$p$, dsB1A1$p$, ddA12$p$, sA2$p$) intersecting the PMOS active-region structure 50$p$ at various source regions or drain regions of the PMOS transistors. The circuit cell 200C includes terminal-conductors (such as, sB2$n$, ddB1A1$n$, and sA2$n$) intersecting the NMOS active-region structure 50$n$ at various source regions or drain regions of the NMOS transistors. The circuit cell 200C includes horizontal conducting lines 222C, 224C1, 224C2, 228C1, 228C2, and 228C3 extending in the X-direction in a first metal layer (e.g., a metal layer M0). The circuit cell 200C includes vertical conducting lines 271C-276C and 278C-279C extending in the Y-direction in a second metal layer (e.g., a metal layer M1). Each of the vertical conducting lines is aligned with a vertical routing track. Two adjacent vertical routing tracks are separated by a pitch distance of 0.5 CPP.

In FIG. 2C, the joint source terminal ssB12$p$ of the PMOS transistors TB1$p$ and TB2$p$ is configured to receive the upper power supply voltage VDD. Each of the source terminal sB2$n$ of the NMOS transistor TB2$n$ and the source terminal sA2$n$ of the NMOS transistor TA2$n$ is configured to receive the lower power supply voltage VSS. The gate-conductors gA1, gA2, gB1, and gB2 are correspondingly configured to receive the input signal "A1", the input signal "A2", the input signal "B1", and the input signal "B2" of the AOI gate in the circuit cell 200C. The vertical conducting line 275C1 is configured to carry the output signal "ZN" of the AOI gate.

In FIG. 2C, the joint source terminal ssB12$p$ of the PMOS transistors TB1$p$ and TB2$p$ is connected to the vertical conducting line 273C through the horizontal conducting line 224C1, while the vertical conducting line 273C is configured to receive the upper power supply voltage VDD. The drain terminal dB2$p$ of the PMOS transistor TB2$p$ and the drain terminal (which is at the joint terminal dsB1A1$p$) of the PMOS transistor TB1$p$ are conductively connected together through the horizontal conducting line 222C. The source terminal sA2$p$ of the PMOS transistor TA2$p$ and the source terminal (which is at the joint terminal dsB1A1$p$) of the PMOS transistor TA1$p$ are also conductively connected together through the horizontal conducting line 222C. The joint drain terminal ddA12$p$ of the PMOS transistors TA1$p$ and TA2$p$ is conductively connected to the vertical conducting line 275C through the horizontal conducting line 224C2. The vertical conducting line 275C is further connected to the joint drain terminal ddA1B1$n$ of the NMOS transistors TB1$n$ and TA1$n$ through the horizontal conducting lines 228C2. The source terminal of the NMOS transistor TB1$n$ and the drain terminal of the NMOS transistor TB2$n$ are jointed together in the NMOS active-region structure 50$n$. The source terminal of the NMOS transistor TA1$n$ and the drain terminal of the NMOS transistor TA2$n$ are jointed together in the NMOS active-region structure 50$n$.

The source terminal sB2$n$ of the NMOS transistor TB2$n$ is connected to the vertical conducting line 271C through the horizontal conducting lines 228C1, while the vertical conducting line 271C is configured to receive the lower power supply voltage VSS. The source terminal sA2$n$ of the NMOS transistor TA2$n$ is connected to the vertical conducting line 279C through the horizontal conducting lines 228C3, while the vertical conducting line 279C is configured to receive the lower power supply voltage VSS.

In FIG. 2C, each of the horizontal conducting lines 224C1, 228C1, and 228C3 functions as a power stub, and each of the vertical conducting lines, 273C, 271C, and 279C functions as a power line. In some embodiments, when a power stub extends in the X-direction, the length of the power stub is smaller than the width of the circuit cell, and the power stub is bounded between the dummy gate-conductors g101 and g109.

In the integrated circuits as specified by the layout diagrams of FIGS. 1A-1C and FIGS. 2A-2C, each of the horizontal conducting lines is aligned with one of the horizontal routing tracks, and there are four horizontal routing tracks per unit cell height. For example, each of the circuit cells in FIGS. 1A-1B and FIGS. 2A-2B is a single height cell, and there are four horizontal routing tracks available for positioning the horizontal conducting lines. Each of the circuit cells in FIG. 1C and FIG. 2C is a double height cell, and there are eight horizontal routing tracks available for positioning the horizontal conducting lines.

In some alternative designs of the integrated circuits, the number of the horizontal routing tracks per unit cell height is reduced. In the integrated circuits as specified by the layout diagrams of FIGS. 3A-3C and FIGS. 4A-4C, each of the horizontal conducting lines is still aligned with one of the horizontal routing tracks, but the number of the horizontal routing tracks per unit cell height is reduced to three. For example, each of the circuit cells in FIGS. 3A-3B and FIGS. 4A-4B is a single height cell, and there are three horizontal routing tracks available for positioning the horizontal conducting lines. Each of the circuit cells in FIG. 3C and FIG. 4C is a double height cell, and there are six horizontal routing tracks available for positioning the horizontal conducting lines.

Figure 4A:
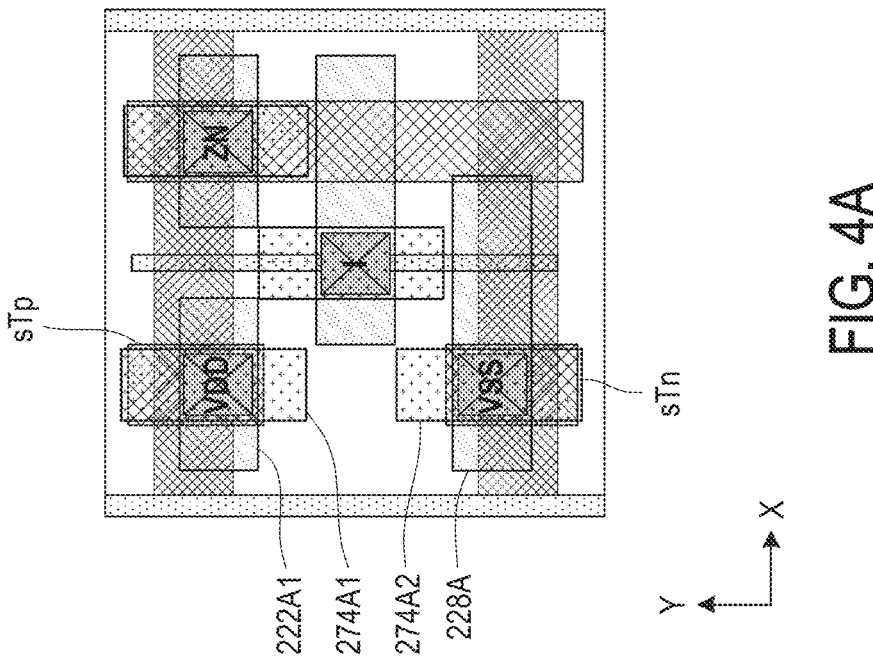
FIGS. 4A-4C are layout diagrams of circuit cells, in accordance with some embodiments.
Figure 3A:
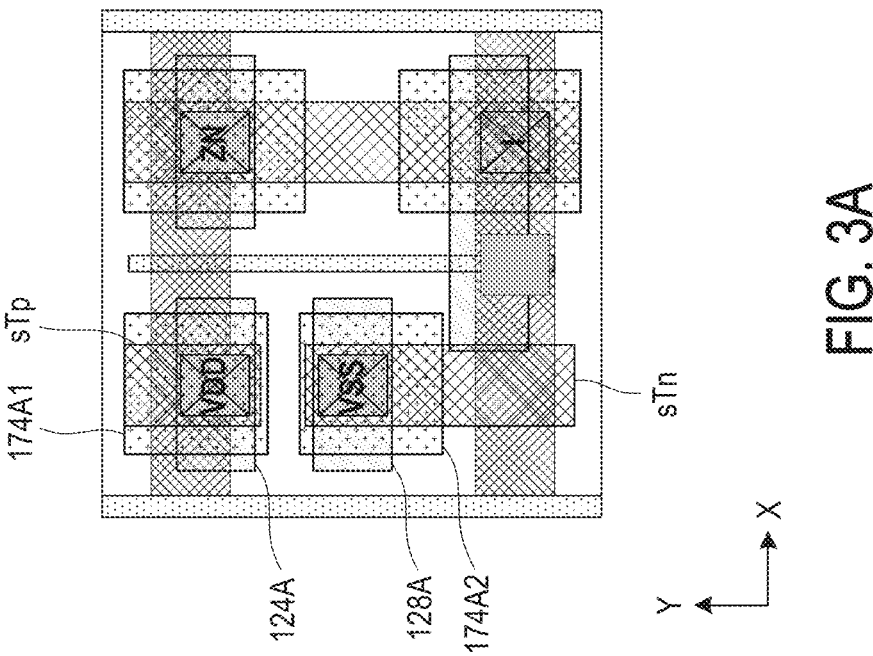
FIGS. 3A-3C are layout diagrams of circuit cells, in accordance with some embodiments.
Figure 4B:
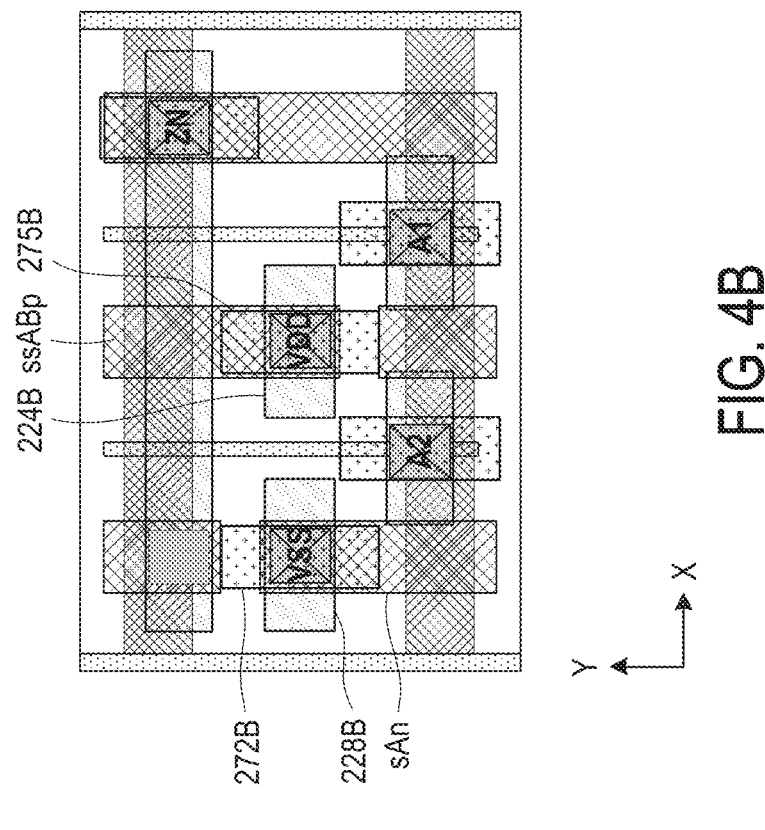
Figure 3B:
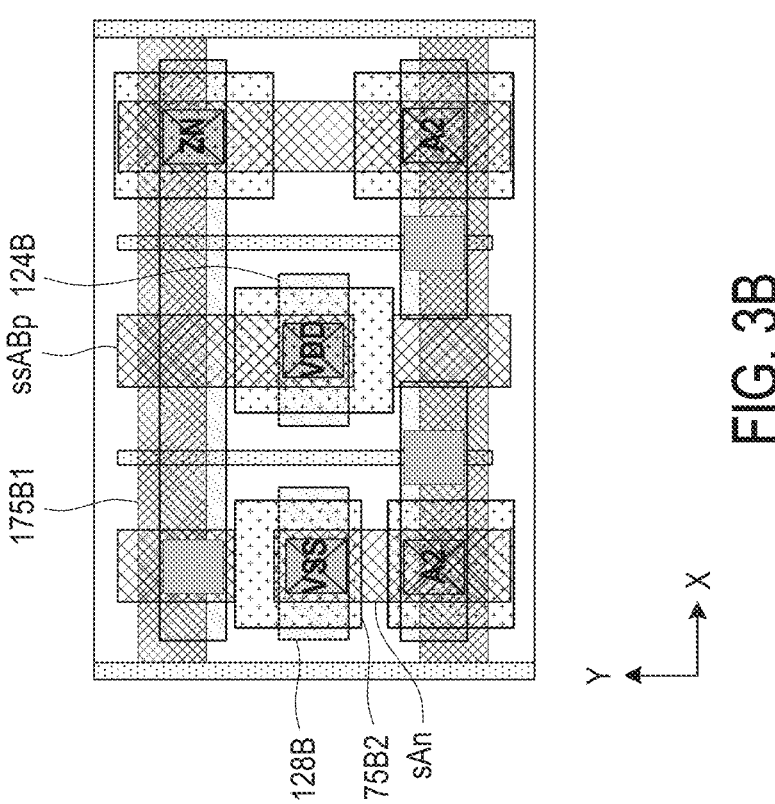
Figure 3C:
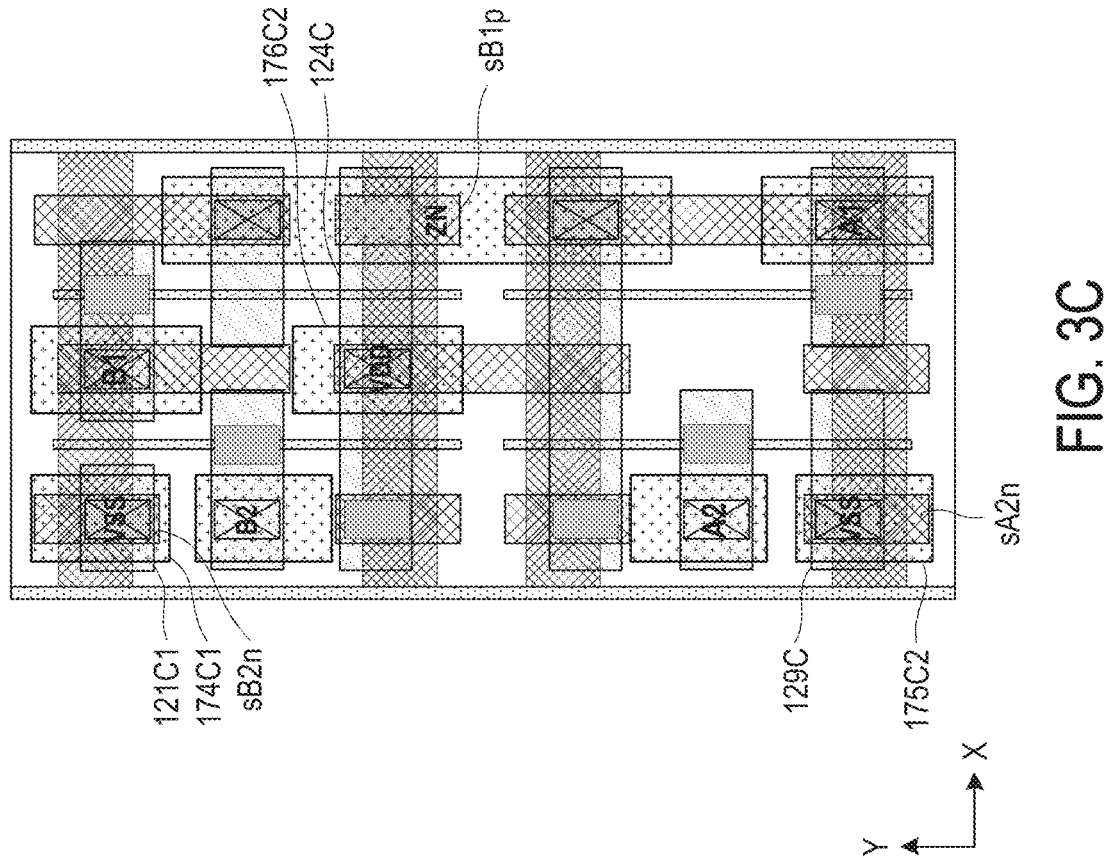
Figure 4C:
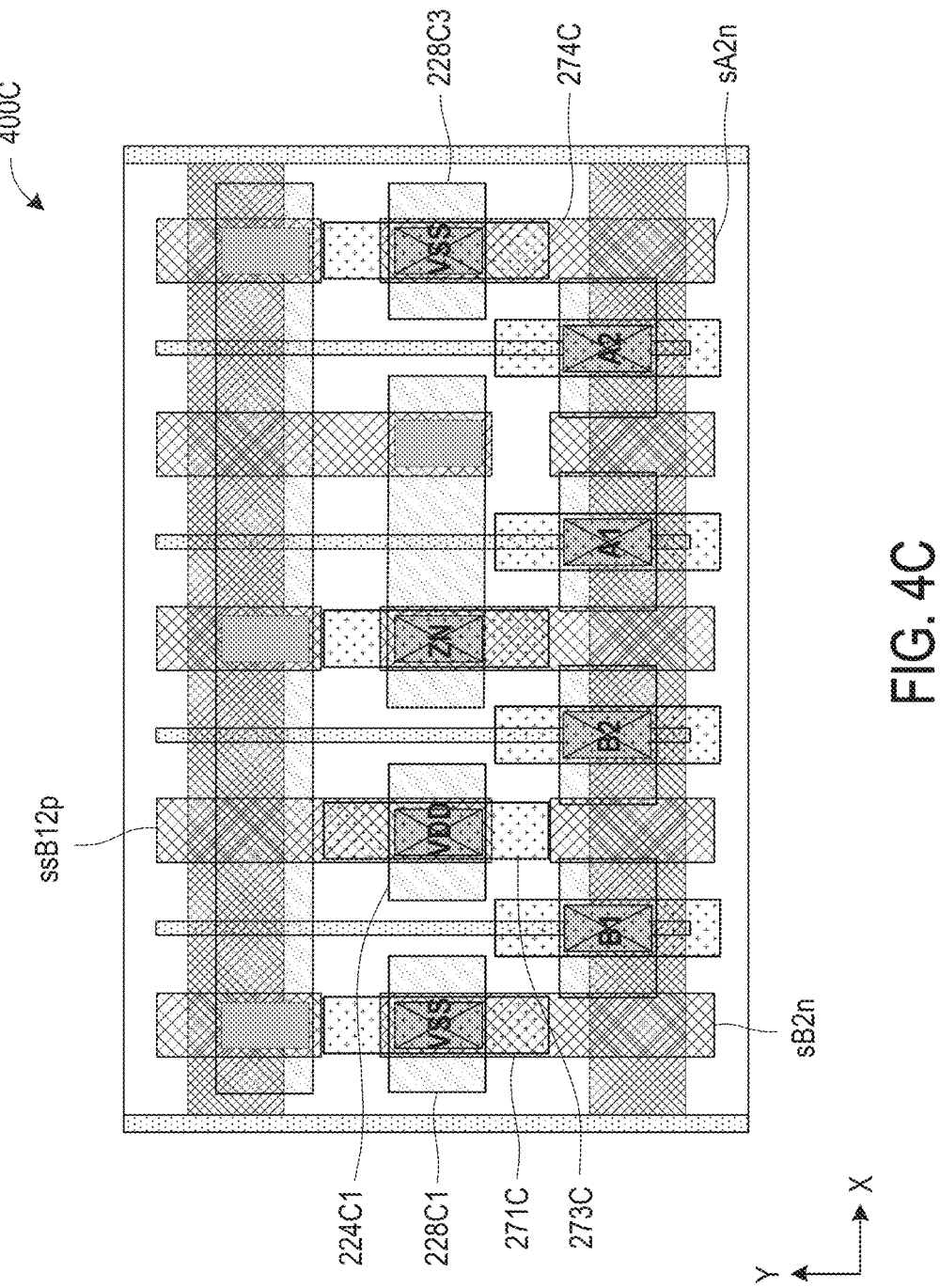

FIG. 3A and FIG. 4A are layout diagrams of circuit cells 300A and 400A each implemented with an inverter, in accordance with some embodiments. FIG. 3B and FIG. 4B are layout diagrams of circuit cells 300B and 400B each implemented with a NAND gate, in accordance with some embodiments. FIG. 3C and FIG. 4C are layout diagrams of circuit cells 300C and 400C each implemented with an AOI gate (i.e., an AND-OR-Inverter), in accordance with some embodiments.

The circuit cells 300A of FIG. 3A is modified from the circuit cells 100A of FIG. 1A by changing the geometric positions of the horizontal conducting lines in the first metal layer and the vertical conducting lines in the second metal layer. Despite the change of the geometric positions, each of the supply voltages (such as VDD and VSS) is still applied to the source terminal of a transistor through a horizontal conducting line in the first metal layer and a vertical conducting line in the second metal layer. In the circuit cell 300A of FIG. 3A, the source terminal sTp of the PMOS transistor Tp is conductively connected to the horizontal conducting line 124A which is conductively connected to the vertical conducting line 174A1, while the vertical conducting line 174A1 is configured to receive the upper power supply voltage VDD. The source terminal sTn of the NMOS transistor Tn is conductively connected to the horizontal conducting line 128A which is conductively connected to the vertical conducting line 174A2, while the vertical conducting line 174A2 is configured to receive the lower power supply voltage VSS.

The circuit cells 400A of FIG. 4A is modified from the circuit cells 200A of FIG. 2A by changing the geometric positions of the horizontal conducting lines in the first metal layer and the vertical conducting lines in the second metal layer. Despite the change of the geometric positions, each of the supply voltages (such as VDD and VSS) is still applied to the source terminal of a transistor through a horizontal conducting line in the first metal layer and a vertical conducting line in the second metal layer. In the circuit cell 400A of FIG. 4A, the source terminal sTp of the PMOS transistor Tp is conductively connected to the horizontal conducting line 222A1 which is conductively connected to the vertical conducting line 274A1, while the vertical conducting line 274A1 is configured to receive the upper power supply voltage VDD. The source terminal sTn of the NMOS transistor Tn is conductively connected to the horizontal conducting line 228A which is conductively connected to the vertical conducting line 274A2, while the vertical conducting line 274A2 is configured to receive the lower power supply voltage VSS.

The circuit cells 300B of FIG. 3B is modified from the circuit cells 100B of FIG. 1B by changing the geometric positions of the horizontal conducting lines in the first metal layer and the vertical conducting lines in the second metal layer. Despite the change of the geometric positions, each of the supply voltages (such as VDD and VSS) is still applied to the source terminal of a transistor through a horizontal conducting line in the first metal layer and a vertical conducting line in the second metal layer. In the circuit cell 300B of FIG. 3B, the joint source terminal ssABp of the PMOS transistors TAp and TBp is connected to the vertical conducting line 175B1 through the horizontal conducting lines 124B, while the vertical conducting line 175B1 is configured to receive the upper power supply voltage VDD. The source terminal sAn of the NMOS transistor TAn is connected to the vertical conducting line 175B2 through the horizontal conducting lines 128B, while the vertical conducting line 175B2 is configured to receive the lower power supply voltage VSS.

The circuit cells 400B of FIG. 4B is modified from the circuit cells 200B of FIG. 2B by changing the geometric positions of the horizontal conducting lines in the first metal layer and the vertical conducting lines in the second metal layer. Despite the change of the geometric positions, each of the supply voltages (such as VDD and VSS) is still applied to the source terminal of a transistor through a horizontal conducting line in the first metal layer and a vertical conducting line in the second metal layer. In the circuit cell 400B of FIG. 4B, the joint source terminal ssABp of the PMOS transistors TAp and TBp is connected to the vertical conducting line 275B through the horizontal conducting lines 224B, while the vertical conducting line 275B is configured to receive the upper power supply voltage VDD. The source terminal sAn of the NMOS transistor TAn is connected to the vertical conducting line 272B through the horizontal conducting lines 228B, while the vertical conducting line 272B is configured to receive the lower power supply voltage VSS.

The circuit cells 300C of FIG. 3C is modified from the circuit cells 100C of FIG. 1C by changing the geometric positions of the horizontal conducting lines in the first metal layer and the vertical conducting lines in the second metal layer. Despite the change of the geometric positions, each of the supply voltages (such as VDD and VSS) is still applied to the source terminal of a transistor through a horizontal conducting line in the first metal layer and a vertical conducting line in the second metal layer. In the circuit cell 300C of FIG. 3C, the source terminal sB1p of the PMOS transistors TB1p and the source terminal sB2p of the PMOS transistors TB2p is connected to the vertical conducting line 176C2 through the horizontal conducting line 124C, while the vertical conducting line 176C2 is configured to receive the upper power supply voltage VDD. The source terminal sA2n of the NMOS transistor TA2n is connected to the vertical conducting line 175C2 through the horizontal conducting lines 129C, while the vertical conducting line 175C2 is configured to receive the lower power supply voltage VSS. The source terminal sB2n of the NMOS transistor TB2n is connected to the vertical conducting line 174C1 through the horizontal conducting lines 121C1, while the vertical conducting line 174C1 is configured to receive the lower power supply voltage VSS.

The circuit cells 400C of FIG. 4C is modified from the circuit cells 200C of FIG. 2C by changing the geometric positions of the horizontal conducting lines in the first metal layer and the vertical conducting lines in the second metal layer. Despite the change of the geometric positions, each of the supply voltages (such as VDD and VSS) is still applied to the source terminal of a transistor through a horizontal conducting line in the first metal layer and a vertical conducting line in the second metal layer. In the circuit cell 400C of FIG. 4C, the joint source terminal ssB12p of the PMOS transistors TB1p and TB2p is connected to the vertical conducting line 273C through the horizontal conducting line 224C1, while the vertical conducting line 273C is configured to receive the upper power supply voltage VDD. The source terminal sB2n of the NMOS transistor TB2n is connected to the vertical conducting line 271C through the horizontal conducting lines 228C1, while the vertical conducting line 271C is configured to receive the lower power supply voltage VSS. The source terminal sA2n of the NMOS transistor TA2n is connected to the vertical conducting line 279C through the horizontal conducting lines 228C3, while the vertical conducting line 279C is configured to receive the lower power supply voltage VSS.

Figure 6A:
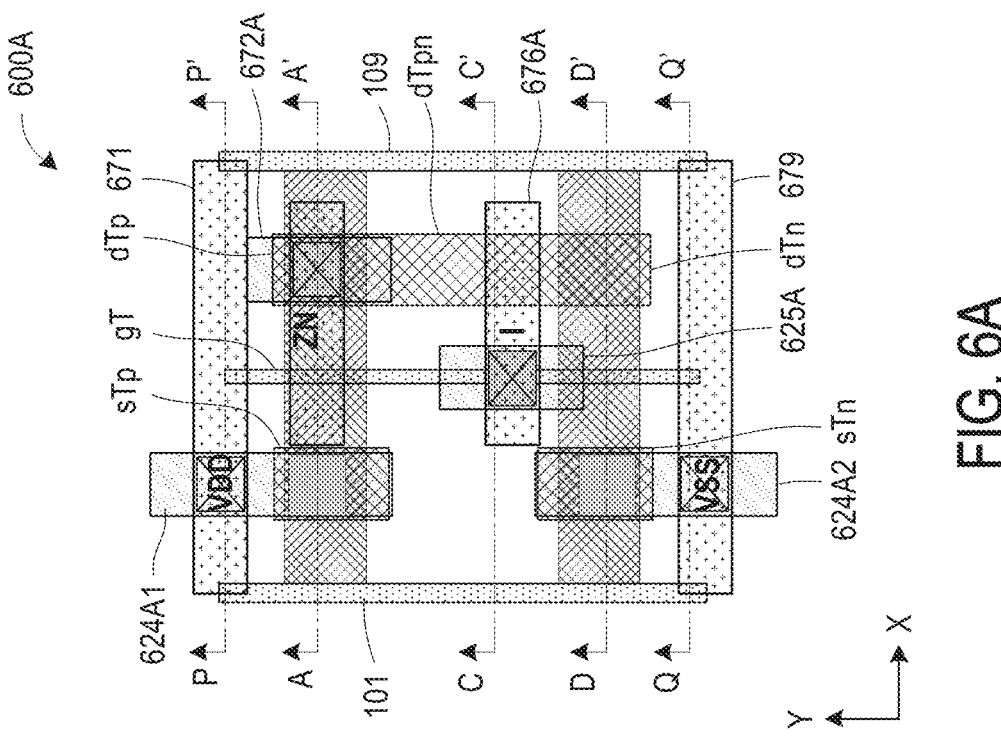
FIGS. 6A-6C are layout diagrams of circuit cells, in accordance with some embodiments.
Figure 5A:
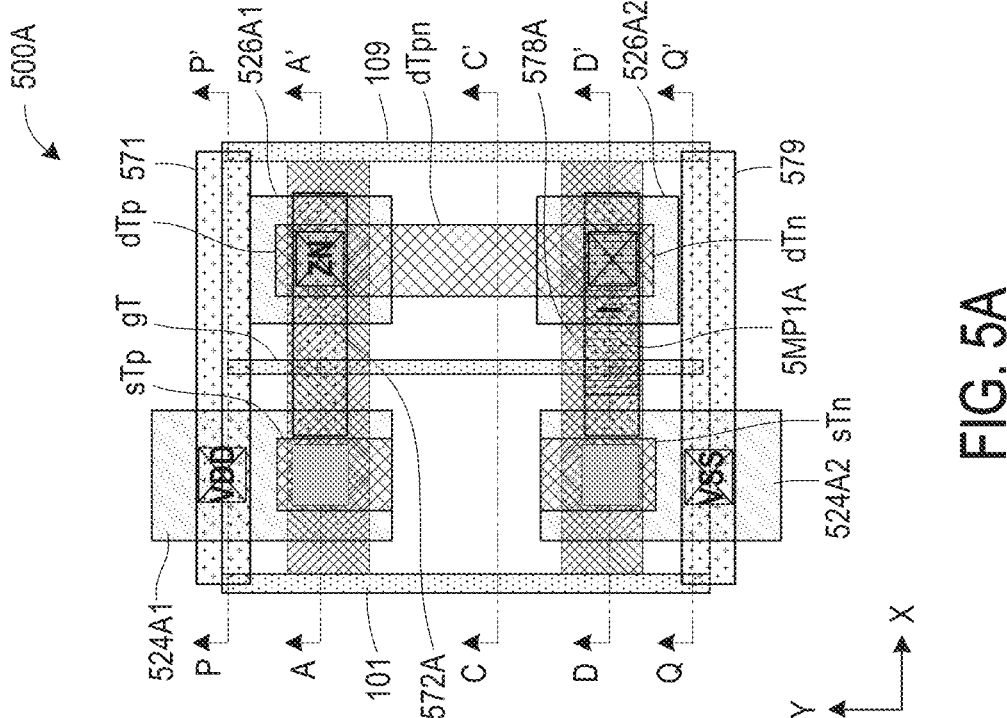
FIGS. 5A-5C are layout diagrams of circuit cells, in accordance with some embodiments.
Figures 5B, 6B:
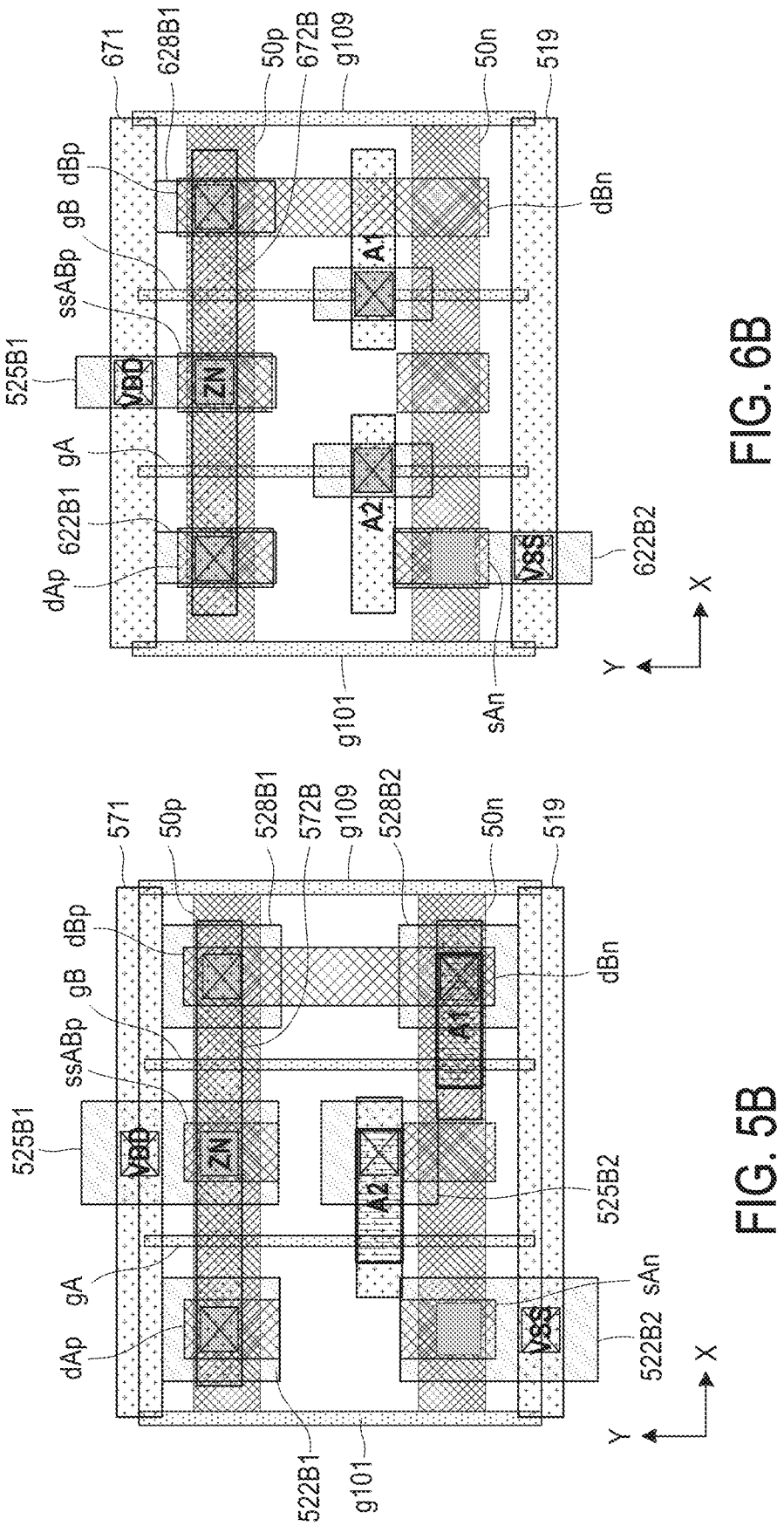
Figure 5C:
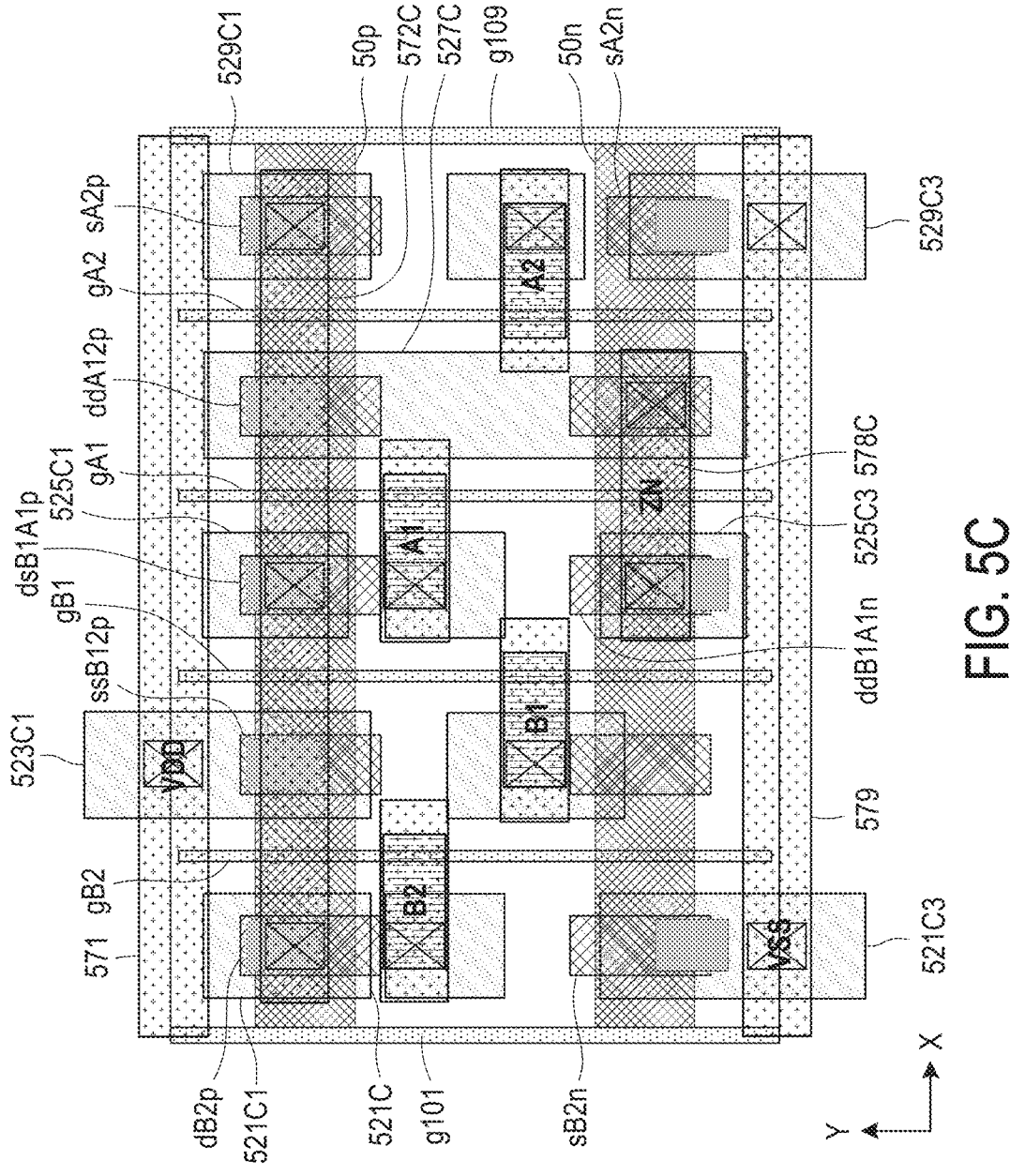
Figure 6C:
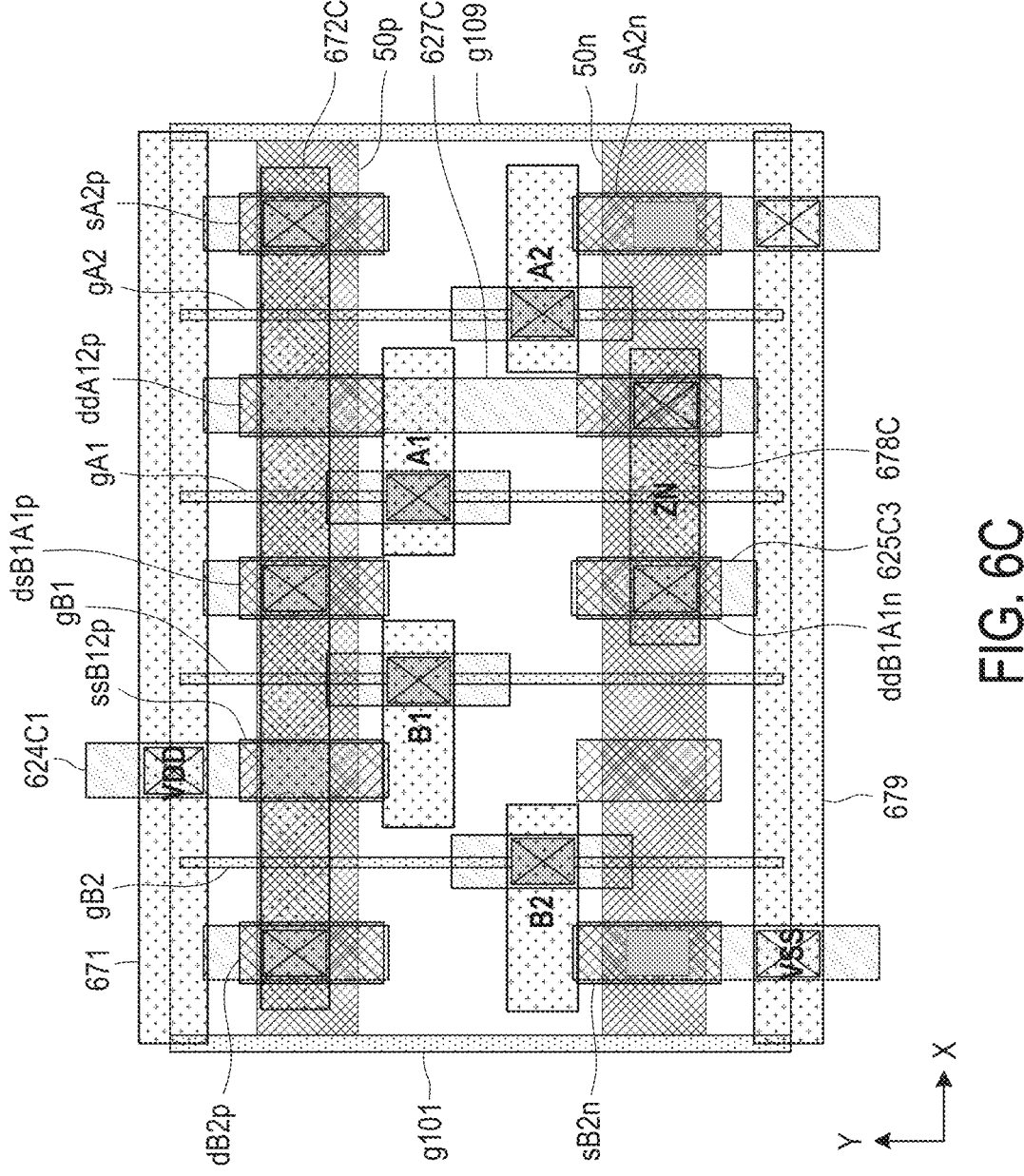

FIG. 5A and FIG. 6A are layout diagrams of circuit cells 500A and 600A each implemented with an inverter, in accordance with some embodiments. FIG. 5B and FIG. 6B are layout diagrams of circuit cells 500B and 600B each implemented with a NAND gate, in accordance with some embodiments. FIG. 5C and FIG. 6C are layout diagrams of circuit cells 500C and 600C each implemented with an AOI gate (i.e., an AND-OR-Inverter), in accordance with some embodiments.

In FIG. 5A and FIG. 6A, each of the circuit cells 500A and 600A includes a PMOS active-region structure 50p and an NMOS active-region structure 50n extending in the X-direction. Each of the circuit cells 500A and 600A includes a gate-conductor gT extending in the Y-direction. Each of the circuit cells 500A and 600A also includes the dummy gate-conductors g101 and g109 at the vertical cell boundaries of the circuit cells. The gate-conductor gT intersects the PMOS active-region structure 50p at the channel region of the PMOS transistor Tp and intersects the NMOS active-region structure 50n at the channel region of the NMOS transistor Tn.

Each of the circuit cells 500A and 600A also includes terminal-conductors (such as, sTp, sTn, and dTpn) intersecting the PMOS active-region structure 50p or the NMOS active-region structure 50n at various source regions or drain regions of the transistors. The source terminal sTp of the PMOS transistor Tp is configured to receive the upper power supply voltage VDD, and the source terminal sTn of the NMOS transistor Tn is configured to receive the lower power supply voltage VSS. The terminal-conductor dTpn connects the drain terminal dTp of the PMOS transistor Tp with the drain terminal dTn of the NMOS transistor Tn. The gate terminal of the PMOS transistor Tp and the gate terminal of the NMOS transistor Tn are conductively connected through the gate-conductor gT. The gate-conductor gT is configured to carry an input signal "I" of the inverter, and the terminal-conductor dTpn is configured to carry an output signal "Z" of the inverter.

In FIG. 5A, the circuit cell 500A includes vertical conducting lines 524A1, 524A2, 526A1, and 526A2 extending in the Y-direction in a first metal layer (e.g., a metal layer M0). Each of the vertical conducting lines is aligned with a vertical routing track. Two adjacent vertical routing tracks are separated by a pitch distance of one CPP. The circuit cell 500A also includes power rails 571 and 579 and vertical conducting lines 572A and 578A extending in the X-direction in a second metal layer (e.g., a metal layer M1). The cross-sectional views of the circuit cell 500A are shown in FIGS. 5D-5H.

Figures 5D, 5E, 5F, 6D, 6E, 6F:
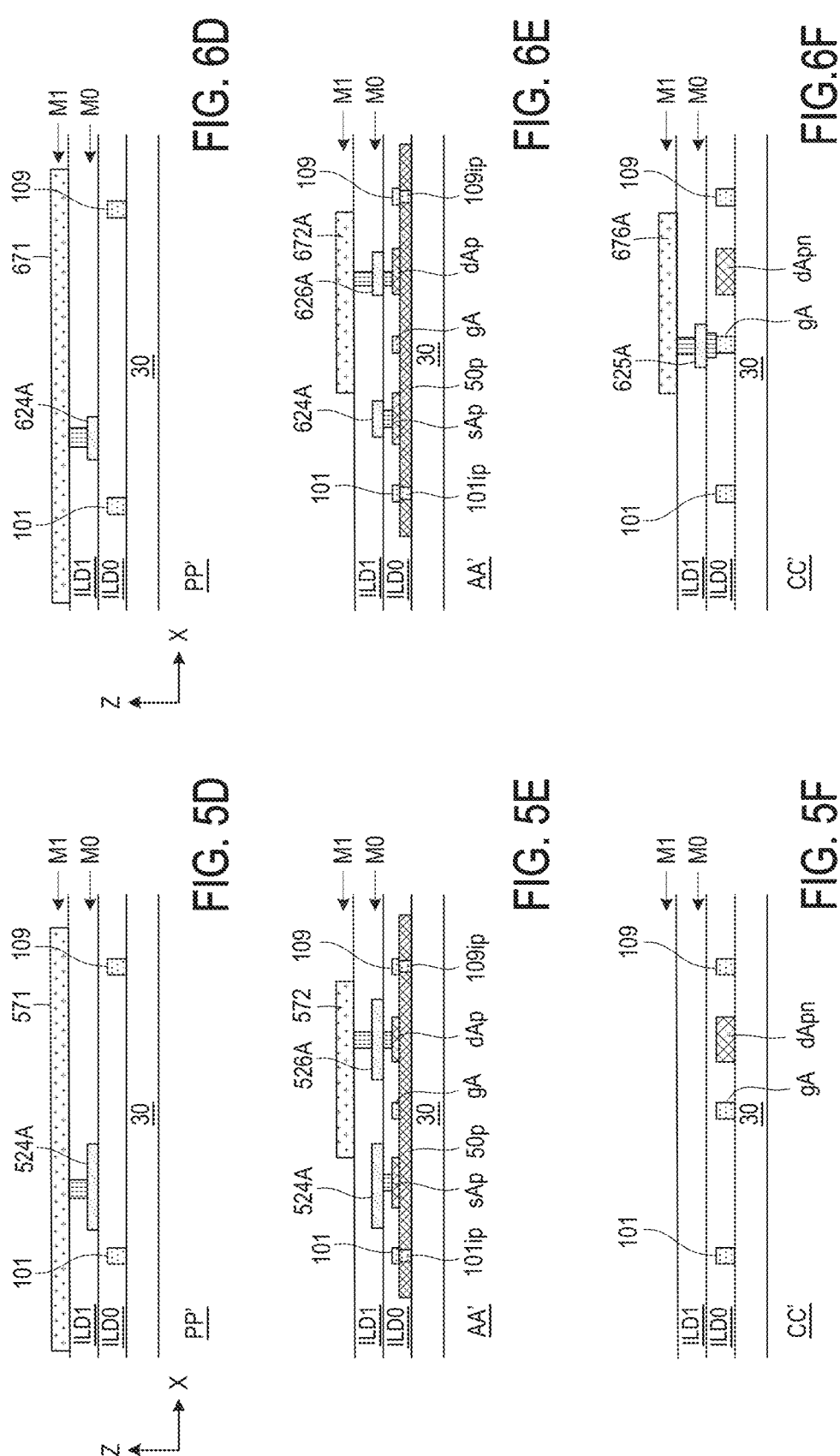

FIG. 5D is a cross-sectional view of the circuit cell 500A along the cutting plane PP' as shown in FIG. 5A, in accordance with some embodiments. FIG. 5E is a cross-sectional view of the circuit cell 500A along the cutting plane AA' as shown in FIG. 5A, in accordance with some embodiments. FIG. 5F is a cross-sectional view of the circuit cell 500A along the cutting plane CC' as shown in FIG. 5A, in accordance with some embodiments. FIG. 5G is a cross-sectional view of the circuit cell 500A along the cutting plane DD' as shown in FIG. 5A, in accordance with some embodiments. FIG. 5H is a cross-sectional view of the circuit cell 500A along the cutting plane QQ' as shown in FIG. 5A, in accordance with some embodiments.

As shown in FIGS. 5D-5H, the vertical conducting lines 524A1, 524A2, 526A1, and 526A2 are fabricated in a first metal layer (e.g., a metal layer M0) overlying a first interlayer dielectric ILD0 that covers the PMOS active-region structure 50$p$, the NMOS active-region structure 50$n$, the gate-conductor gT, and various terminal-conductors. The horizontal conducting lines 572A and 578A are fabricated in a second metal layer (e.g., a metal layer M1) overlying a second interlayer dielectric ILD1 that covers the vertical conducting lines in the first metal layer.

Additionally, the gate-conductor gT is connected the vertical conducting lines 526A2 through a conductor 5MPg2, and the vertical conducting lines 526A2 is connected to the horizontal conducting line 578A which is configured as an input pin for the inverter in the circuit cell 500A. The terminal-conductor dTp is connected to the horizontal conducting line 572A through the vertical conducting line 526A1, while the horizontal conducting line 572A is configured as an output pin for the inverter in the circuit cell 500A.

In FIG. 5A and FIGS. 5D-5H, the source terminal sTp of the PMOS transistor Tp is directly connected to the vertical conducting line 524A1 with a via connector VD, and the vertical conducting line 524A1 is directly connected to the power rail 571 with a via connector V0. The power rail 571 is configured to receive the upper power supply voltage VDD. The source terminal sTn of the NMOS transistor Tn is directly connected to the vertical conducting line 524A2 with a via connector VD, and the vertical conducting line 524A2 is directly connected to the power rail 579 with a via connector V0. The power rail 579 is configured to receive the lower power supply voltage VSS. Each of the power rail 571 and the power rail 579 extends along the X-direction and crosses multiple circuit cells (not shone in the figure) in the same cell row as the circuit cell 500A.

In FIG. 5A and FIGS. 5D-5H, each of the vertical conducting lines 524A1 and 524A2 functions as a power stub, and each of the power rail 571 and the power rail 579 functions as a power line for the circuit cell 500A. In some embodiments, as shown in FIG. 5A, a power stub extending in the Y-direction extends across a power rail (e.g., 571 or 579) at a horizontal cell boundary of the circuit cell. In some embodiments, as shown in FIG. 5A, a power stub extends in the Y-direction and passes across a power rail (e.g., 571 or 579) at a horizontal cell boundary of the circuit cell. In some embodiments, when a power stub extends in the Y-direction, the length of the power stub is smaller than the height of the circuit cell. In the embodiments as shown in FIG. 5A, each of the power rail 571 and the power rail 579 is aligned with one of the horizontal cell boundaries of the circuit cell. In some alternative embodiments, at least one power line is aligned with a horizontal routing track that is between the two horizontal cell boundaries of the circuit cell.

In FIG. 6A, the circuit cell 600A includes vertical conducting lines 624A1, 624A2, 626A1, and 625A extending in the Y-direction in a first metal layer (e.g., a metal layer M0). Each of the vertical conducting lines is aligned with a vertical routing track. Two adjacent vertical routing tracks are separated by a pitch distance of 0.5 CPP. The circuit cell 600A also includes power rails 671 and 679 and vertical conducting lines 672A and 676A extending in the X-direction in a second metal layer (e.g., a metal layer M1). The cross-sectional views of the circuit cell 600A are shown in FIGS. 6D-6H.

FIG. 6D is a cross-sectional view of the circuit cell 600A along the cutting plane PP' as shown in FIG. 6A, in accordance with some embodiments. FIG. 6E is a cross-sectional view of the circuit cell 600A along the cutting plane AA' as shown in FIG. 6A, in accordance with some embodiments. FIG. 6F is a cross-sectional view of the circuit cell 600A along the cutting plane CC' as shown in FIG. 6A, in accordance with some embodiments. FIG. 6G is a cross-sectional view of the circuit cell 600A along the cutting plane DD' as shown in FIG. 6A, in accordance with some embodiments. FIG. 6H is a cross-sectional view of the circuit cell 600A along the cutting plane QQ' as shown in FIG. 6A, in accordance with some embodiments.

As shown in FIGS. 6D-6H, the vertical conducting lines 624A1, 624A2, 626A1, and 625A are fabricated in a first metal layer (e.g., a metal layer M0) overlying a first interlayer dielectric ILD0 that covers the PMOS active-region structure 50$p$, the NMOS active-region structure 50$n$, the gate-conductor gT, and various terminal-conductors. The horizontal conducting lines 672A and 676A are fabricated in a second metal layer (e.g., a metal layer M1) overlying a second interlayer dielectric ILD1 that covers the vertical conducting lines in the first metal layer.

Additionally, the gate-conductor gT is connected the vertical conducting lines 625A through a via connector VG, and the vertical conducting lines 625A is connected to the horizontal conducting line 676A which is configured as an input pin for the inverter in the circuit cell 600A. The terminal-conductor dTp is connected to the horizontal conducting line 672A through the vertical conducting line 626A1, while the horizontal conducting line 672A is configured as an output pin for the inverter in the circuit cell 600A.

In FIG. 6A and FIGS. 6D-6H, the source terminal sTp of the PMOS transistor Tp is directly connected to the vertical conducting line 624A1 with a via connector VD, and the vertical conducting line 624A1 is directly connected to the power rail 671 with a via connector V0. The power rail 671 is configured to receive the upper power supply voltage VDD. The source terminal sTn of the NMOS transistor Tn is directly connected to the vertical conducting line 624A2 with a via connector VD, and the vertical conducting line 624A2 is directly connected to the power rail 679 with a via connector V0. The power rail 679 is configured to receive the lower power supply voltage VSS. Each of the power rail 671 and the power rail 679 extends along the X-direction and crosses multiple circuit cells (not shone in the figure) in the same cell row as the circuit cell 600A.

In FIG. 6A and FIGS. 6D-6H, each of the vertical conducting lines 624A1 and 624A2 functions as a power stub, and each of the power rail 671 and the power rail 679 functions as a power line for the circuit cell 600A. In some embodiments, as shown in FIG. 6A, a power stub extends in the Y-direction and passes across a power rail (e.g., 671 or 679) at a horizontal cell boundary of the circuit cell. In some embodiments, as shown in FIG. 6A, a power stub extending in the Y-direction extends across a power rail (e.g., 671 or 679) at a horizontal cell boundary of the circuit cell. In some embodiments, when a power stub extends in the Y-direction, the length of the power stub is smaller than the height of the circuit cell. In the embodiments as shown in FIG. 6A, each of the power rail 671 and the power rail 679 is aligned with one of the horizontal cell boundaries of the circuit cell. In some alternative embodiments, at least one power line is aligned with a horizontal routing track that is between the two horizontal cell boundaries of the circuit cell.

In some other embodiments, a circuit cell is implemented as a NAND gate. In FIG. 5B and FIG. 6B, each of the circuit cells 500B and 600B includes a PMOS active-region structure 50$p$ and an NMOS active-region structure 50$n$ extending in the X-direction. Each of the circuit cells 500B and 600B includes gate-conductors gA and gB extending in the Y-direction. Each of the circuit cells 500B and 600B also includes the dummy gate-conductors g101 and g109 at the vertical cell boundaries of the circuit cells. The gate-conductor gA intersects the PMOS active-region structure 50$p$ at the channel region of the PMOS transistor TAp and intersects the NMOS active-region structure 50$n$ at the channel region of the NMOS transistor TAn. The gate-conductor gB intersects the PMOS active-region structure 50$p$ at the channel region of the PMOS transistor TBp and intersects the NMOS active-region structure 50$n$ at the channel region of the NMOS transistor TBn.

Each of the circuit cells 500B and 600B also includes terminal-conductors (such as, dAp, ssABp, dBp, sAn, and dBn) intersecting the PMOS active-region structure 50$p$ or the NMOS active-region structure 50$n$ at various source regions or drain regions of the transistors. The joint source terminal ssABp of the PMOS transistors TAp and TBp is configured to receive the upper power supply voltage VDD, and the source terminal sAn of the NMOS transistor TAn is configured to receive the lower power supply voltage VSS. The drain terminal dAp of the PMOS transistor TAp and the drain terminal dBp of the PMOS transistor TBp are conductively connected through a horizontal conducting line (such as, 572B in FIG. 5B or 672B in FIG. 6B). The drain terminal dBp of the PMOS transistor TBp and the drain terminal dBn of the NMOS transistor TBn are conductively connected through the terminal-conductor dBpn. The source terminal of the NMOS transistor TBn and the drain terminal of the NMOS transistor TAn are jointed together in the NMOS active-region structure 50$n$.

In FIG. 5B, the circuit cell 500B includes vertical conducting lines 522B1, 522B2, 525B1, and 528B1 extending in the Y-direction a first metal layer (e.g., a metal layer M0). Each of the vertical conducting lines is aligned with a vertical routing track. Two adjacent vertical routing tracks are separated by a pitch distance of one CPP. The circuit cell 500B also includes power rails 571 and 579 and a horizontal conducting line 572B extending in the X-direction in a second metal layer (e.g., a metal layer M1). The joint source terminal ssABp of the PMOS transistors TAp and TBp is connected to the vertical conducting line 525B1 which is connected to the power rail 571. The power rail 571 is configured to receive the upper power supply voltage VDD. The source terminal sAn of the NMOS transistor TAn is connected to the vertical conducting line 522B2 which is connected to the power rail 579. The power rail 579 is configured to receive the lower power supply voltage VSS. In FIG. 5B, each of the vertical conducting lines 525B1 and 522B2 functions as a power stub, and each of the power rail 571 and 579 functions as a power line for the circuit cell 500B Additionally, in FIG. 5B, the drain terminal dAp of the PMOS transistor TAp is connected to the vertical conducting line 522B1, and the drain terminal dBp of the PMOS transistor TBn is connected to the vertical conducting line 528B1, while the vertical conducting line 522B1 and the vertical conducting line 528B1 are conductively connected together through the horizontal conducting line 572B. The horizontal conducting line 572B is configured as an output pin for the NAND gate in the circuit cell 500B.

In FIG. 6B, the circuit cell 600B includes vertical conducting lines 622B1, 622B2, 625B1, and 628B1 extending in the Y-direction a first metal layer (e.g., a metal layer M0). Each of the vertical conducting lines is aligned with a vertical routing track. Two adjacent vertical routing tracks are separated by a pitch distance of 0.5 CPP. The circuit cell 600B also includes power rails 671 and 679 and a horizontal conducting line 672B extending in the X-direction in a second metal layer (e.g., a metal layer M1). The joint source terminal ssABp of the PMOS transistors TAp and TBp is connected to the vertical conducting line 625B1 which is connected to the power rail 671. The power rail 671 is configured to receive the upper power supply voltage VDD. The source terminal sAn of the NMOS transistor TAn is connected to the vertical conducting line 622B2 which is connected to the power rail 679. The power rail 679 is configured to receive the lower power supply voltage VSS. In FIG. 6B, each of the vertical conducting lines 625B1 and 622B2 functions as a power stub, and each of the power rail 671 and 679 functions as a power line for the circuit cell 600B Additionally, in FIG. 6B, the drain terminal dAp of the PMOS transistor TAp is connected to the vertical conducting line 622B1, and the drain terminal dBp of the PMOS transistor TBn is connected to the vertical conducting line 628B1, while the vertical conducting line 622B1 and the vertical conducting line 628B1 are conductively connected together through the horizontal conducting line 672B. The horizontal conducting line 672B is configured as an output pin for the NAND gate in the circuit cell 600B.

In some other embodiments, a circuit cell is implemented as an AOI gate. In FIG. 5C and FIG. 6C, each of the circuit cells 500C and 600C includes a PMOS active-region structure 50$p$ and an NMOS active-region structure 50$n$ extending in the X-direction. Each of the circuit cells 500C and 600C includes gate-conductors gA1, gA2, gB1, and gB2 extending in the Y-direction. Each of the circuit cells 500C and 600C also includes the dummy gate-conductors g101 and g109 at the vertical cell boundaries of the circuit cells. The gate-conductors gA1, gA2, gB1, and gB2 intersect the PMOS active-region structure 50$p$ correspondingly at the channel regions of the PMOS transistors TA1$p$, TA2$p$, TB1$p$, and TB2$p$. The gate-conductors gA1, gA2, gB1, and gB2 intersect the NMOS active-region structure 50$n$ correspondingly at the channel regions of the NMOS transistors TA1$n$, TA2$n$, TB1$n$, and TB2$n$.

In FIG. 5C and FIG. 6C, each of the circuit cells 500C and 600C includes terminal-conductors (such as, dB2$p$, ssB12$p$, dsB1A1$p$, ddA12$p$, sA2$p$) intersecting the PMOS active-region structure 50$p$ at various source regions or drain regions of the PMOS transistors. Each of the circuit cells 500C and 600C includes terminal-conductors (such as, sB2$n$, ddB1A1$n$, and sA2$n$) intersecting the NMOS active-region structure 50$n$ at various source regions or drain regions of the NMOS transistors.

In FIG. 5C and FIG. 6C, the joint source terminal ssB12$p$ of the PMOS transistors TB1$p$ and TB2$p$ is configured to receive the upper power supply voltage VDD. Each of the source terminal sB2$n$ of the NMOS transistor TB2$n$ and the source terminal sA2$n$ of the NMOS transistor TA2$n$ is configured to receive the lower power supply voltage VSS. The gate-conductors gA1, gA2, gB1, and gB2 are correspondingly configured to receive the input signal "A1", the input signal "A2", the input signal "B1", and the input signal "B2" of the AOI gate. One of the terminal-conductors (i.e., ddA12$p$) is configured to carry the output signal "ZN" of the AOI gate.

In FIG. 5C, the circuit cell 500C includes vertical conducting lines 521C1, 521C3, 523C1, 525C1, 527C, 529C1, and 529C3 extending in the Y-direction in a first metal layer (e.g., a metal layer M0). Each of the vertical conducting lines is aligned with a vertical routing track. Two adjacent vertical routing tracks are separated by a pitch distance of one CPP. The circuit cell 500C includes horizontal conducting lines 572C and 578C extending in the X-direction in a second metal layer (e.g., a metal layer M1).

In FIG. 5C, the joint source terminal ssB12$p$ of the PMOS transistors TB1$p$ and TB2$p$ is connected to the vertical conducting line 523C1, and the vertical conducting line 523C1 is connected to the power rail 571 which is configured to receive the upper power supply voltage VDD. The drain terminal dB2$p$ of the PMOS transistor TB2$p$ and the drain terminal (which is at the joint terminal dsB1A1$p$) of the PMOS transistor TB1$p$ are conductively connected to the horizontal conducting line 572C through one of the corresponding vertical conducting lines 521C1 and 525C1. The source terminal sA2$p$ of the PMOS transistor TA2$p$ and the source terminal (which is at the joint terminal dsB1A1$p$) of the PMOS transistor TA1$p$ are also conductively connected to the horizontal conducting line 572C through one of the corresponding vertical conducting lines 525C1 and 529C1. The joint drain terminal ddA12$p$ of the PMOS transistors TA1$p$ and TA2$p$ is conductively connected to the vertical conducting line 527C which is connected to the horizontal conducting line 578C. The horizontal conducting line 578C is further connected to the joint drain terminal ddA1B1$n$ of the NMOS transistors TB1$n$ and TA1$n$ through the vertical conducting lines 525C3. The source terminal of the NMOS transistor TB1$n$ and the drain terminal of the NMOS transistor TB2$n$ are jointed together in the NMOS active-region structure 50$n$. The source terminal of the NMOS transistor TA1$n$ and the drain terminal of the NMOS transistor TA2$n$ are jointed together in the NMOS active-region structure 50$n$.

Each of the source terminal sB2$n$ of the NMOS transistor TB2$n$ and the source terminal sA2$n$ of the NMOS transistor TA2$n$ is connected to the power rail 579 correspondingly through of the vertical conducting lines 521C3 and 529C3, while the power line 579 is configured to receive the lower power supply voltage VSS. In FIG. 5C, each of the vertical conducting lines 523C1, 521C3, and 529C3 functions as a power stub, and each of the power rails 571 and 579 functions as a power line for the circuit cell 500C.

In FIG. 6C, the circuit cell 600C includes vertical conducting lines 621C1, 621C3, 623C1, 625C1, 627C, 629C1, and 629C3 extending in the Y-direction in a first metal layer (e.g., a metal layer M0). Each of the vertical conducting lines is aligned with a vertical routing track. Two adjacent vertical routing tracks are separated by a pitch distance of 0.5 CPP. The circuit cell 600C includes horizontal conducting lines 672C and 678C extending in the X-direction in a second metal layer (e.g., a metal layer M1). The circuit cell 600C also includes vertical conducting lines 622C, 624C, 626C, and 628C extending in the Y-direction in the first metal layer and correspondingly aligned with gate-conductors gB2, gB2, gA1, and gA2.

In FIG. 6C, the joint source terminal ssB12$p$ of the PMOS transistors TB1$p$ and TB2$p$ is connected to the vertical conducting line 623C1, and the vertical conducting line 623C1 is connected to the power rail 671 which is configured to receive the upper power supply voltage VDD. The drain terminal dB2$p$ of the PMOS transistor TB2$p$ and the drain terminal (which is at the joint terminal dsB1A1$p$) of the PMOS transistor TB1$p$ are conductively connected to the horizontal conducting line 672C through one of the corresponding vertical conducting lines 621C1 and 625C1. The source terminal sA2$p$ of the PMOS transistor TA2$p$ and the source terminal (which is at the joint terminal dsB1A1$p$) of the PMOS transistor TA1$p$ are also conductively connected to the horizontal conducting line 672C through one of the corresponding vertical conducting lines 625C1 and 629C1. The joint drain terminal ddA12$p$ of the PMOS transistors TA1$p$ and TA2$p$ is conductively connected to the vertical conducting line 627C which is connected to the horizontal conducting line 678C. The horizontal conducting line 678C is further connected to the joint drain terminal ddA1B1$n$ of the NMOS transistors TB1$n$ and TA1$n$ through the vertical conducting lines 625C3. The source terminal of the NMOS transistor TB1$n$ and the drain terminal of the NMOS transistor TB2$n$ are jointed together in the NMOS active-region structure 50$n$. The source terminal of the NMOS transistor TA1$n$ and the drain terminal of the NMOS transistor TA2$n$ are jointed together in the NMOS active-region structure 50$n$.

Each of the source terminal sB2$n$ of the NMOS transistor TB2$n$ and the source terminal sA2$n$ of the NMOS transistor TA2$n$ is connected to the power rail 679 correspondingly through of the vertical conducting lines 621C3 and 629C3, while the power line 679 is configured to receive the lower power supply voltage VSS. In FIG. 6C, each of the vertical conducting lines 623C1, 621C3, and 629C3 functions as a power stub, and each of the power rails 671 and 679 functions as a power line for the circuit cell 600C.

In the integrated circuits as specified by the layout diagrams of FIGS. 5A-5C and FIGS. 6A-6C, each of the horizontal conducting lines is aligned with one of the horizontal routing tracks in the second metal layer, and there are four horizontal routing tracks in each of the circuit cells of FIGS. 5A-5C and FIGS. 6A-6C. For example, in FIG. 6C, the horizontal conducting line 672C occupies a first horizontal routing track, the horizontal conducting lines connected to the gate-conductors gB1 and gA1 occupies a second horizontal routing track, the horizontal conducting lines connected to the gate-conductors gB2 and gA2 occupies a third horizontal routing track, and the horizontal conducting line 678C occupies a first horizontal routing track and a fourth horizontal routing track.

In some alternative designs of the integrated circuits, the number of the horizontal routing tracks per unit cell height is reduced. In the integrated circuits as specified by the layout diagrams of FIGS. 7A-7C and FIGS. 8A-8C, each of the horizontal conducting lines is still aligned with one of the horizontal routing tracks, but the number of the horizontal routing tracks per unit cell height is reduced to three.

Figure 8A:
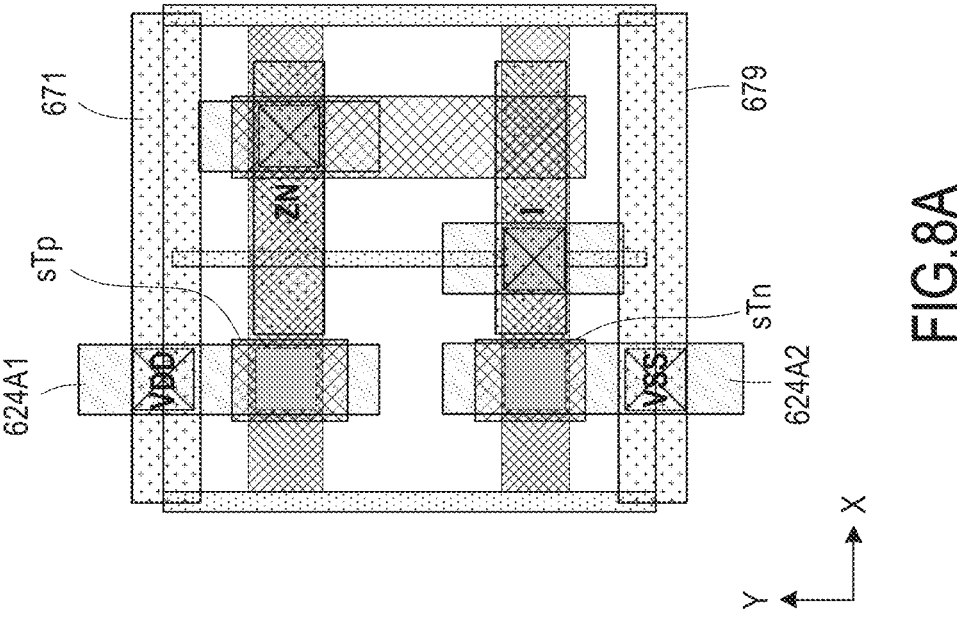
FIGS. 8A-8C are layout diagrams of circuit cells, in accordance with some embodiments.
Figure 7A:
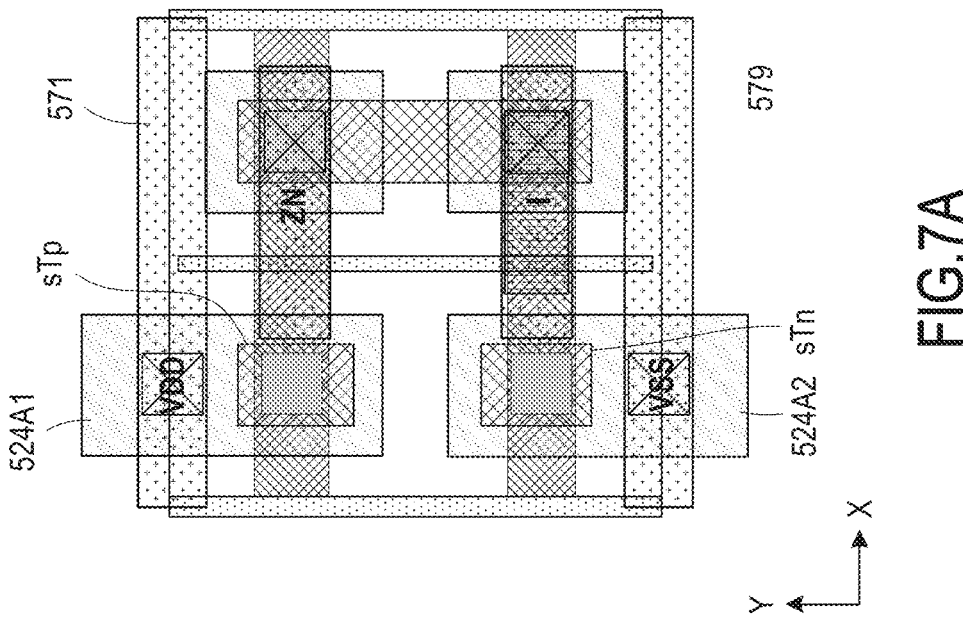
FIGS. 7A-7C are layout diagrams of circuit cells, in accordance with some embodiments.
Figure 8B:
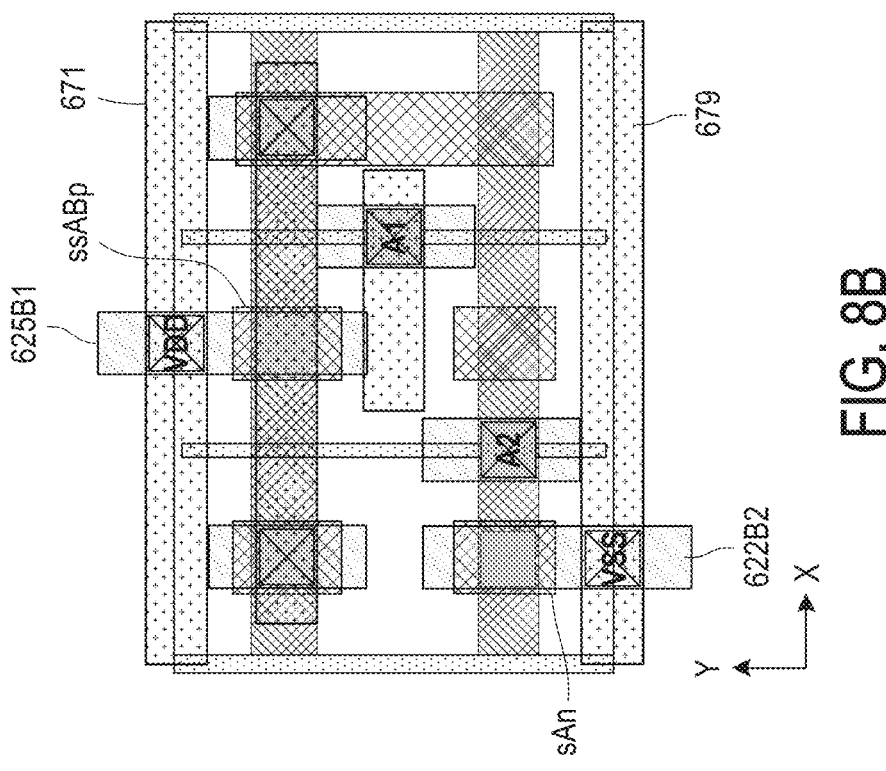
Figure 7B:
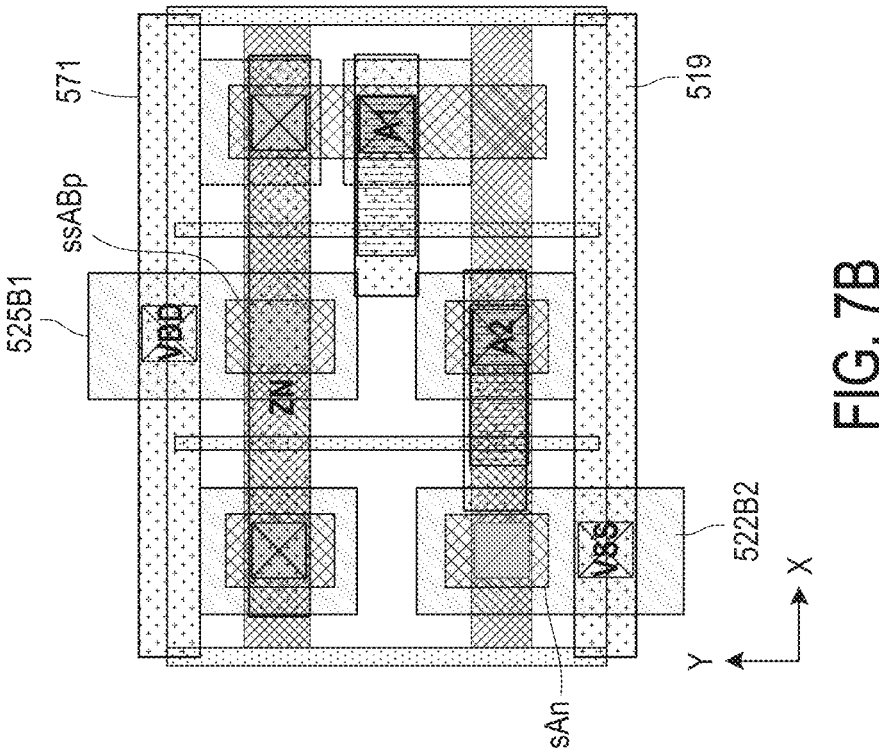
Figure 7C:
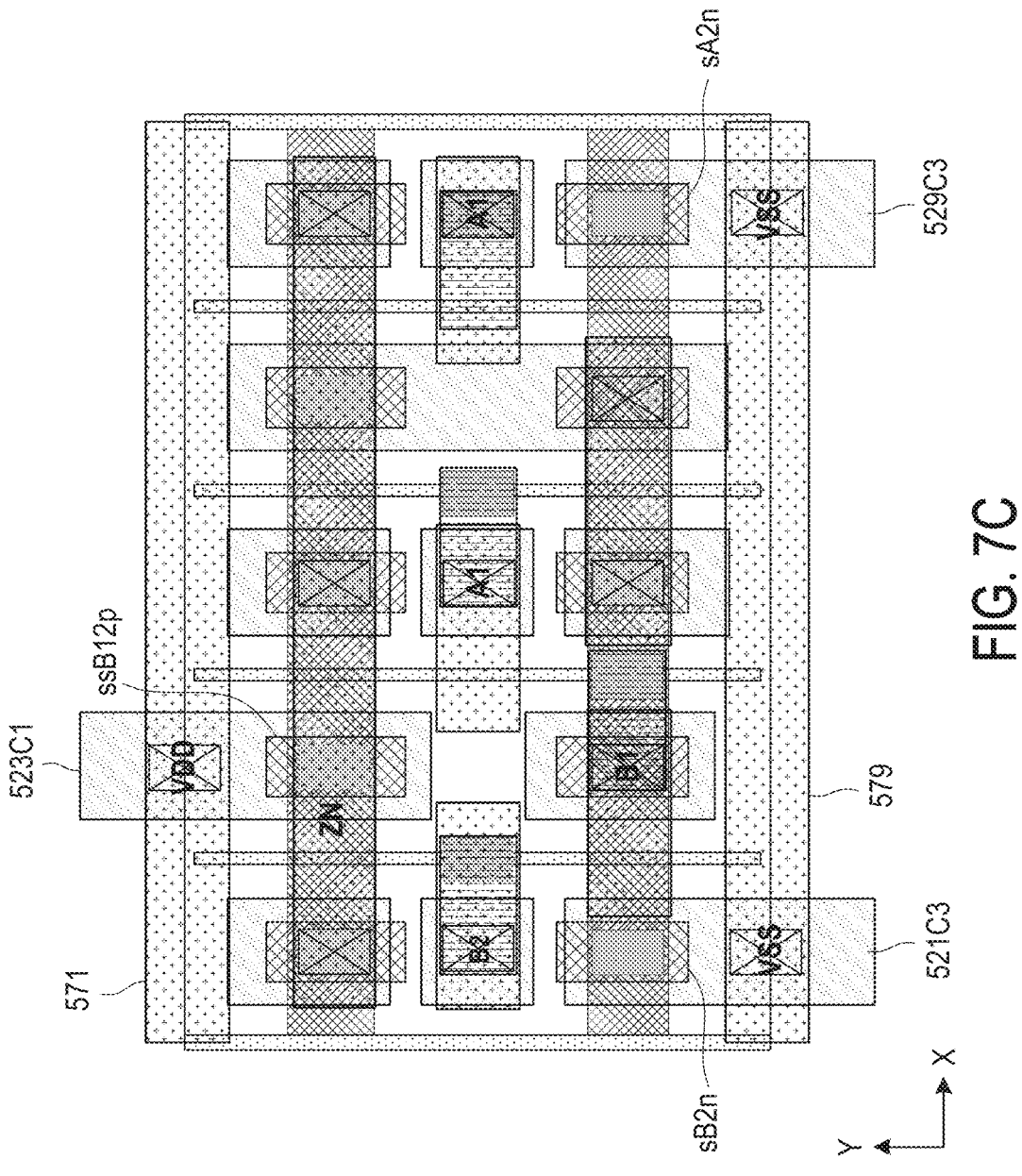
Figure 8C:
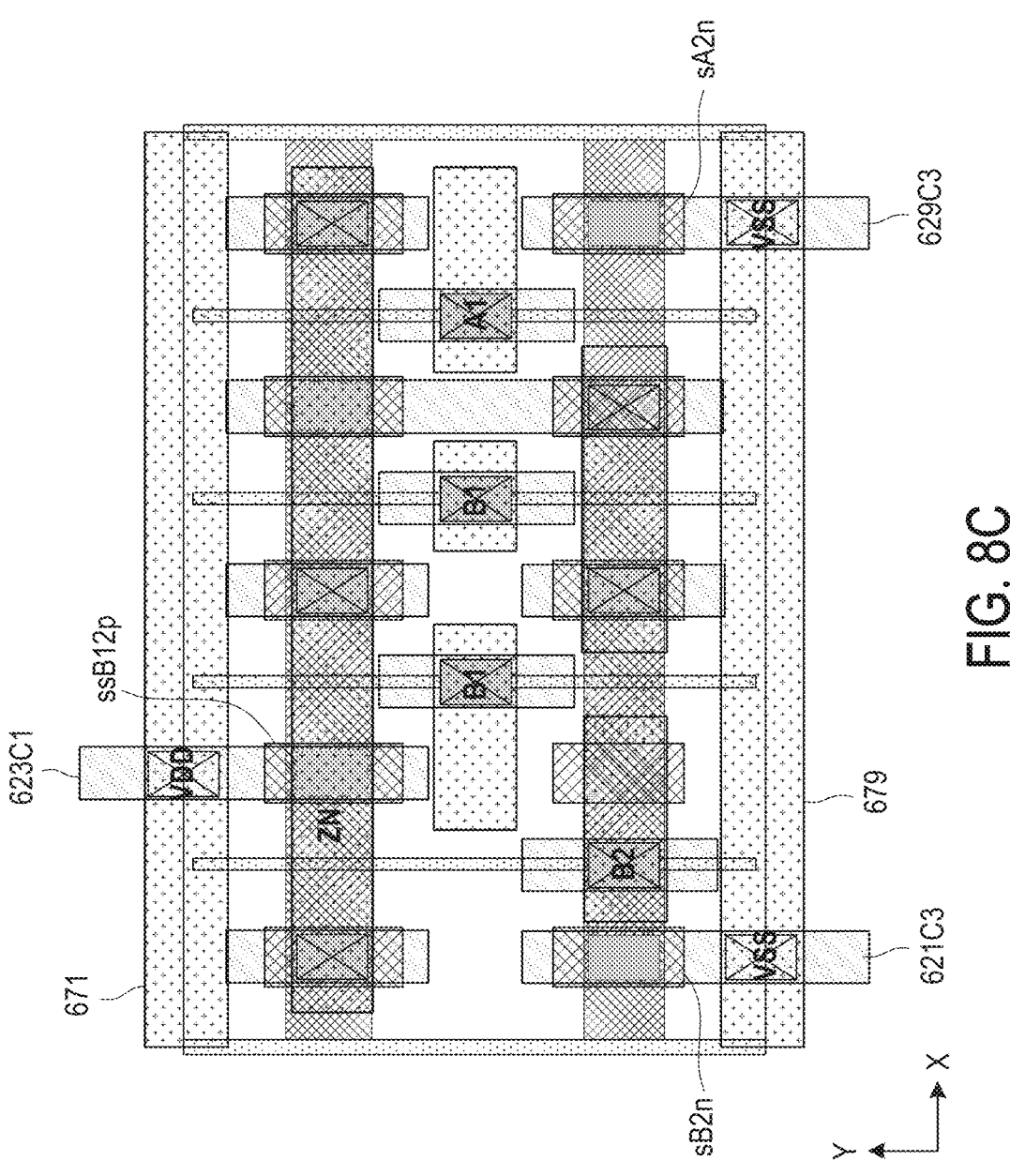

FIG. 7A and FIG. 8A are layout diagrams of circuit cells 700A and 800A each implemented with an inverter, in accordance with some embodiments. FIG. 7B and FIG. 8B are layout diagrams of circuit cells 700B and 800B each implemented with a NAND gate, in accordance with some embodiments. FIG. 7C and FIG. 8C are layout diagrams of circuit cells 700C and 800C each implemented with an AOI gate (i.e., an AND-OR-Inverter), in accordance with some embodiments.

The circuit cells in FIGS. 7A-7C and FIGS. 8A-8C are correspondingly modified from the circuit cells in FIGS. 5A-5C and FIGS. 6A-6C. The modifications include changing the geometric positions of some horizontal conducting lines in the second metal layer. Despite the change of the geometric positions, each of the supply voltages (such as VDD and VSS) on the power rails is still applied to the source terminal of a transistor through a vertical conducting line in the first metal layer.

In the circuit cell 700A of FIG. 7A, the source terminal sTp of the PMOS transistor Tp is conductively connected to the power rail 571 though a vertical conducting line 524A1, and the source terminal nTp of the NMOS transistor Tn is conductively connected to the power rail 579 though a vertical conducting line 524A2. In the circuit cell 800A of FIG. 8A, the source terminal sTp of the PMOS transistor Tp is conductively connected to the power rail 671 though a vertical conducting line 624A1, and the source terminal nTp of the NMOS transistor Tn is conductively connected to the power rail 679 though a vertical conducting line 624A2.

In the circuit cell 700B of FIG. 7B, the joint source terminal ssABp of the PMOS transistors TAp and TBp is conductively connected to the power rail 571 through the vertical conducting line 525B1, and the source terminal sAn of the NMOS transistor TAn is conductively connected to the power rail 579 through the vertical conducting line 522B2. In the circuit cell 800B of FIG. 8B, the joint source terminal ssABp of the PMOS transistors TAp and TBp is conductively connected to the power rail 671 through the vertical conducting line 625B1, and the source terminal sAn of the NMOS transistor TAn is conductively connected to the power rail 679 through the vertical conducting line 622B2.

In the circuit cell 700C of FIG. 7C, the joint source terminal ssB12$p$ of the PMOS transistors TB1$p$ and TB2$p$ is conductively connected to the power rail 571 through the vertical conducting line 523C1, while each of the source terminal sB2$n$ of the NMOS transistor TB2$n$ and the source terminal sA2$n$ of the NMOS transistor TA2$n$ is connected to the power rail 579 correspondingly through of the vertical conducting lines 521C3 and 529C3. In the circuit cell 800C of FIG. 8C, the joint source terminal ssB12$p$ of the PMOS transistors TB1$p$ and TB2$p$ is conductively connected to the power rail 671 through the vertical conducting line 623C1, while each of the source terminal sB2$n$ of the NMOS transistor TB2$n$ and the source terminal sA2$n$ of the NMOS transistor TA2$n$ is connected to the power rail 679 correspondingly through of the vertical conducting lines 621C3 and 629C3.

Figures 9A, 9B:
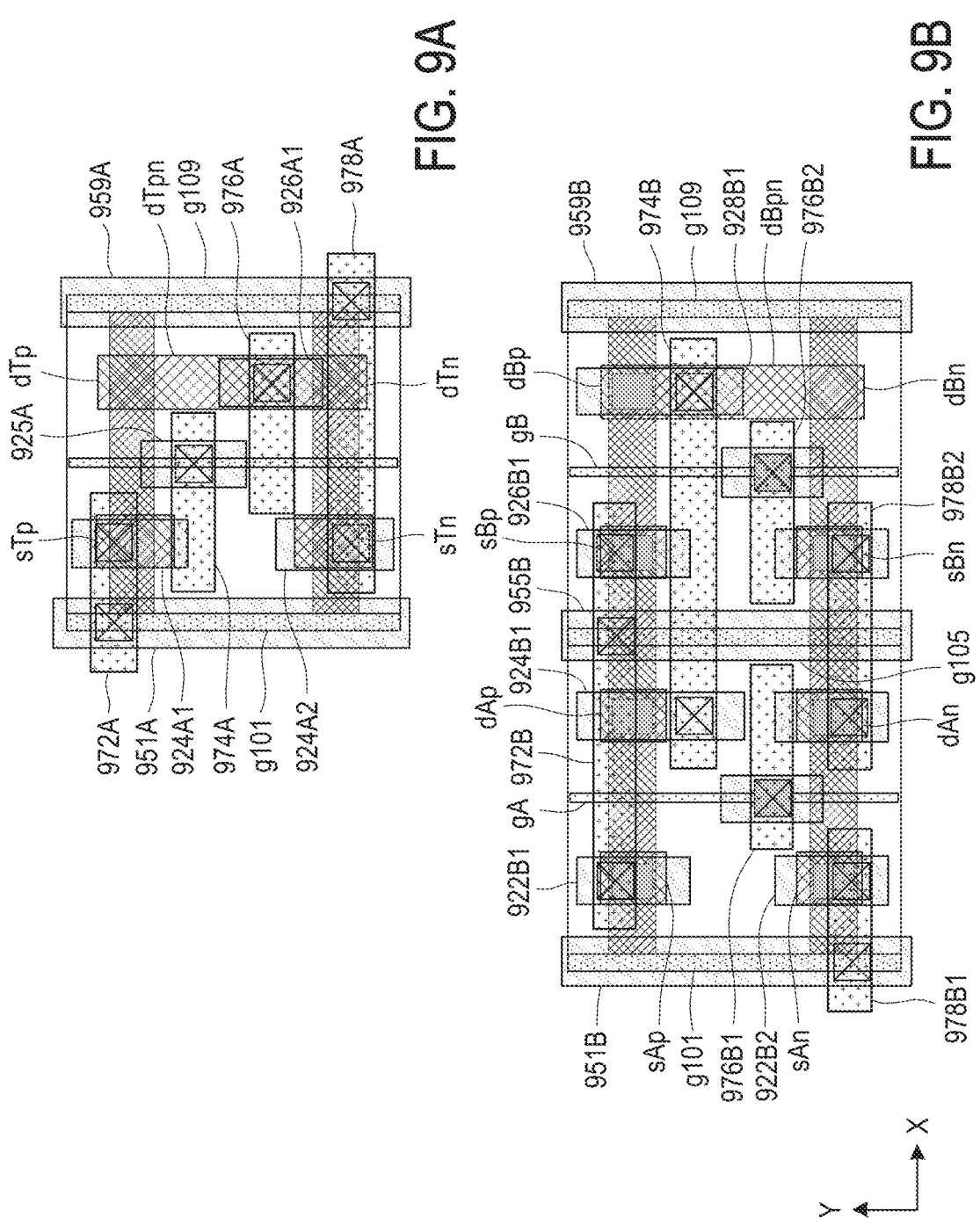
FIGS. 9A-9C are layout diagrams of circuit cells, in accordance with some embodiments.
Figure 9C:
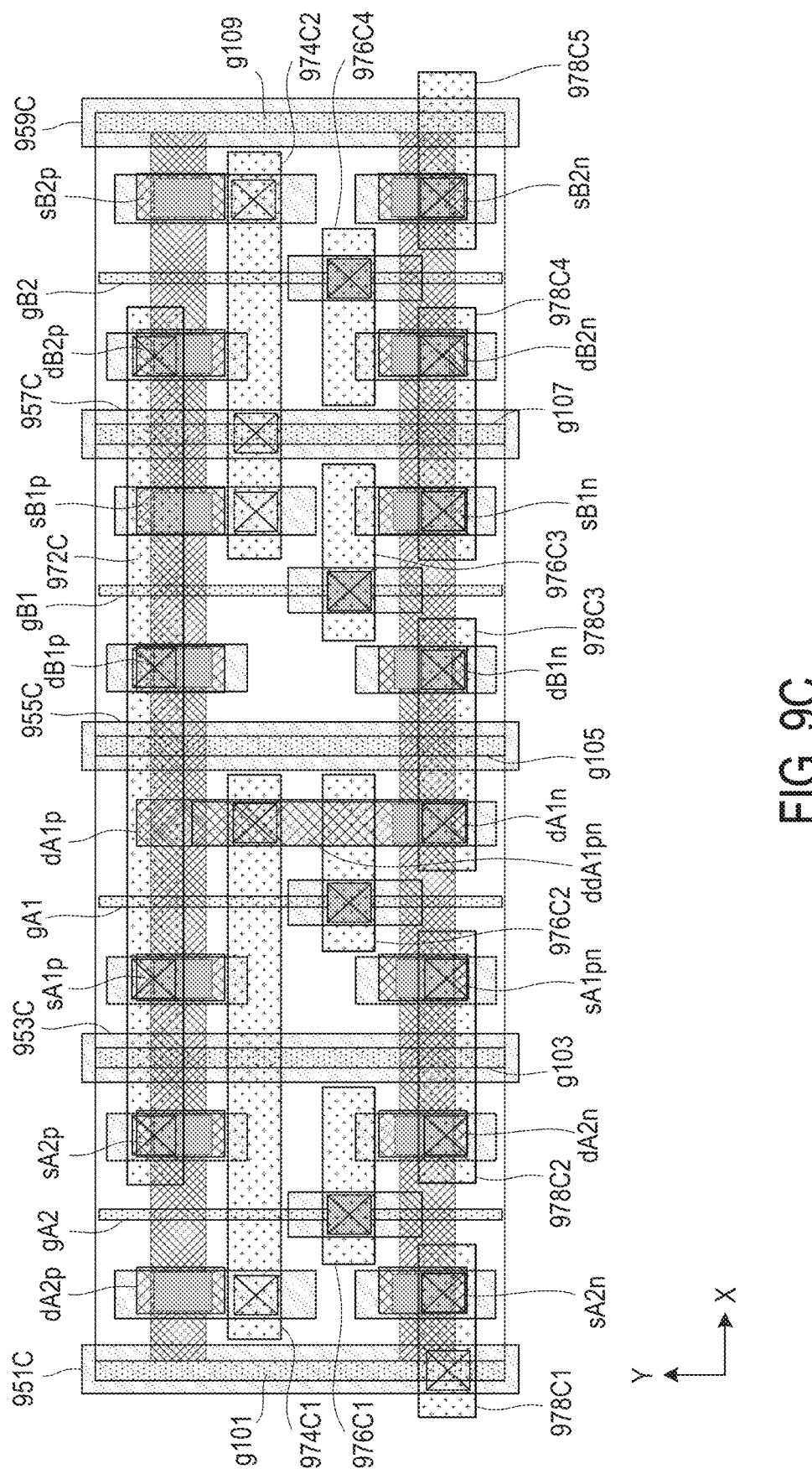

FIG. 9A is a layout diagram of a circuit cell 900A implemented with an inverter, in accordance with some embodiments. FIG. 9B is a layout diagram of a circuit cell 900B implemented with a NAND gate, in accordance with some embodiments. FIG. 9C is a layout diagram of a circuit cell 900C implemented with an AOI gate, in accordance with some embodiments.

In FIG. 9A, the circuit cell 900A includes a PMOS active-region structure 50$p$ and an NMOS active-region structure 50$n$ extending in the X-direction. The circuit cell 900A includes a gate-conductor gT extending in the Y-direction and dummy gate-conductors g101 and g109 at the vertical cell boundaries of the circuit cells. The gate-conductor gT intersects the PMOS active-region structure 50$p$ at the channel region of a PMOS transistor Tp and intersects the NMOS active-region structure 50$n$ at the channel region of a NMOS transistor Tn.

The source terminal sTp of the PMOS transistor Tp is configured to receive the upper power supply voltage VDD, and the source terminal sTn of the NMOS transistor Tn is configured to receive the lower power supply voltage VSS. The terminal-conductor dTpn connects the drain terminal dTp of the PMOS transistor Tp with the drain terminal dTn of the NMOS transistor Tn. The gate terminal of the PMOS transistor Tp and the gate terminal of the NMOS transistor Tn are conductively connected through the gate-conductor gT. The gate-conductor gT is configured to carry an input signal "I" of the inverter, and the terminal-conductor dTpn is configured to carry an output signal "Z" of the inverter.

In FIG. 9A, the circuit cell 900A includes vertical conducting lines 924A1, 924A2, 926A1, and 925A extending in the Y-direction in a first metal layer (e.g., a metal layer M0). Each of the vertical conducting lines is aligned with a vertical routing track. Two adjacent vertical routing tracks are separated by a pitch distance of 0.5 CPP. The circuit cell 900A also includes power rails 951A and 959A in the Y-direction in the first metal layer. The circuit cell 900A further includes vertical conducting lines 972A, 974A, 976A, and 978A extending in the X-direction in a second metal layer (e.g., a metal layer M1).

In FIG. 9A, the source terminal sTp of the PMOS transistor Tp is directly connected to the vertical conducting line 924A1 with a via connector VD, and the vertical conducting line 924A1 is directly connected to the horizontal conducting line 972A with a via connector V0. The horizontal conducting line 972A is further connected to the power rail 951A to with a via connector V0, while the power rail 951A is configured to receive the upper power supply voltage VDD. The source terminal sTn of the NMOS transistor Tn is directly connected to the vertical conducting line 924A2 with a via connector VD, and the vertical conducting line 924A2 is directly connected to the horizontal conducting line 978A with a via connector V0. The horizontal conducting line 978A is further connected to the power rail 959A with a via connector V0, while the power rail 959A is configured to receive the lower power supply voltage VSS. Each of the power rail 951A and the power rail 959A extends along the Y-direction and crosses multiple rows of circuit cells (not shone in the figure).

In FIG. 9A, each of the vertical conducting lines 924A1 and 924A2 functions as a power stub, and each of horizontal conducting lines 972A and 978A functions as a power line for the circuit cell 900A. In some embodiments, when a power stub extends in the Y-direction, the length of the power stub is smaller than the height of the circuit cell.

In some other embodiments, a circuit cell is implemented as a NAND gate. In FIG. 9B, the circuit cell 900B includes a PMOS active-region structure 50$p$ and an NMOS active-region structure 50$n$ extending in the X-direction. The circuit cell 900B includes gate-conductors gA and gB extending in the Y-direction. The circuit cell 900B also includes the dummy gate-conductors g101 and g109 at the vertical cell boundaries of the circuit cells. The gate-conductor gA intersects the PMOS active-region structure 50$p$ at the channel region of the PMOS transistor TAp and intersects the NMOS active-region structure 50$n$ at the channel region of the NMOS transistor TAn. The gate-conductor gB intersects the PMOS active-region structure 50$p$ at the channel region of the PMOS transistor TBp and intersects the NMOS active-region structure 50$n$ at the channel region of the NMOS transistor TBn. The circuit cell 900B also includes terminal-conductors (such as, dAp, sAp, sBp, dBp, sAn, and dBn) intersecting the PMOS active-region structure 50$p$ or the NMOS active-region structure 50$n$ at various source regions or drain regions of the transistors.

In FIG. 9B, the circuit cell 900B includes a dummy gate-conductors g105 extending in the Y-direction. The dummy gate-conductors g105 is separated from each of the gate-conductors gA and gB by a pitch distance of one Contacted Poly Pitch ("CPP"). The dummy gate-conductors g105 is separated from each of the dummy gate-conductors g101 and g109 by a pitch distance of two CPPs. The isolation region in the PMOS active-region structure 50$p$ underneath the dummy gate-conductors g105 isolates the drain terminal dAp of the PMOS transistor TAp from the source terminal sBp of the PMOS transistor TBp. The isolation region in the NMOS active-region structure 50$n$ underneath the dummy gate-conductors g105 isolates the drain terminal dAn of the NMOS transistor TAn from the source terminal sBn of the NMOS transistor TBn.

In FIG. 9B, the circuit cell 900B includes vertical conducting lines 922B1, 922B2, 924B1, 926B1, and 928B1 extending in the Y-direction a first metal layer (e.g., a metal layer M0). Each of the vertical conducting lines is aligned with a vertical routing track. Two adjacent vertical routing tracks are separated by a pitch distance of 0.5 CPP. The circuit cell 900B also includes power rails 951B, 955B, and 959B extending in the Y-direction in the first metal layer. The circuit cell 900B further includes horizontal conducting lines 972B, 974B, 976B1, 976B2, 978B1, and 978B2 extending in the X-direction in a second metal layer (e.g., a metal layer M1).

Each of the source terminal sAp of the PMOS transistor TAp and the source terminal sBp of the PMOS transistor TBp is conductively connected to the horizontal conducting line 972B through a corresponding vertical conducting line 922B1 and 926B1. The horizontal conducting line 972B is connected to the vertical power rail 955B which is configured to receive the upper power supply voltage VDD.

Each of the drain terminal dAp of the PMOS transistor TAp and the drain terminal dBp of the PMOS transistor TBp is conductively connected to the horizontal conducting line 974B through a corresponding vertical conducting line 924B1 and 928B1. The drain terminal dBp of the PMOS transistor TBp is also connected to the drain terminal dBn of the NMOS transistor TBn through the terminal-conductor dBpn. The source terminal sBn of the NMOS transistor TBn and the drain terminal dAn of the NMOS transistor TAn are conductively connected together through the horizontal conducting line 978B2. The source terminal sBn of the NMOS transistor TBn and the drain terminal dAn of the NMOS transistor TAn are conductively connected together through the horizontal conducting line 978B2.

The source terminal sAn of the NMOS transistor TAn is conductively connected to the horizontal conducting line 978B1 through the vertical conducting line 922B2. The horizontal conducting line 978B1 is connected to the vertical power rail 951B which is configured to receive the upper power supply voltage VDD.

Each of the horizontal conducting lines 976B1 and 976B2 is conductively connected to one of the gate-conductors gA and gB through a corresponding vertical conducting line. The horizontal conducting lines 976B1 and 976B2 are configured as input pins of the NAND gate in the circuit cell 900B. The horizontal conducting line 974B is configured as out pin of the NAND gate in the circuit cell 900B.

In some other embodiments, a circuit cell is implemented as an AOI gate. In FIG. 9C, the circuit cell 900C includes a PMOS active-region structure 50$p$ and an NMOS active-region structure 50$n$ extending in the X-direction. The circuit cell 900C includes gate-conductors gA1, gA2, gB1, and gB2 extending in the Y-direction. The circuit cell 900C also includes the dummy gate-conductors g101 and g109 at the vertical cell boundaries of the circuit cells. The gate-conductors gA1, gA2, gB1, and gB2 intersect the PMOS active-region structure 50$p$ correspondingly at the channel regions of the PMOS transistors TA1$p$, TA2$p$, TB1$p$, and TB2$p$. The gate-conductors gA1, gA2, gB1, and gB2 intersect the NMOS active-region structure 50$n$ correspondingly at the channel regions of the NMOS transistors TA1$n$, TA2$n$, TB1$n$, and TB2$n$.

In FIG. 9C, the circuit cell 900C includes dummy gate-conductors g103, g105, and g107 extending in the Y-direction. Each of the dummy gate-conductors is separated from a neighboring gate-conductor by a pitch distance of one Contacted Poly Pitch ("CPP"). Two adjacent dummy gate-conductors are separated from each other by a pitch distance of two CPPs. Each of the PMOS active-region structure 50$p$ and the NMOS active-region structure 50$n$ has isolation regions at intersections where the dummy-gate-conductors intersect the PMOS active-region structure 50$p$ or the NMOS active-region structure 50$n$.

In FIG. 9C, the circuit cell 900C includes terminal-conductors (such as, dA2$p$, sA2$p$, sA1$p$, dA1$p$, dB1$p$, sB1$p$, dB2$p$, and sB2$p$) intersecting the PMOS active-region structure 50$p$ at various source regions or drain regions of the PMOS transistors. The circuit cell 900C includes terminal-conductors (such as, sA2$n$, dA2$n$, sA1$n$, dA1$n$, dB1$n$, sB1$n$, dB2$n$, and sB2$n$).

In FIG. 9C, the source terminal sB1$p$ of the PMOS transistors TB1$p$ and the source terminal sB2$p$ of TB2$p$ are configured to receive the upper power supply voltage VDD. Each of the source terminal sB2$n$ of the NMOS transistor TB2$n$ and the source terminal sA2$n$ of the NMOS transistor TA2$n$ is configured to receive the lower power supply voltage VSS. The gate-conductors gA1, gA2, gB1, and gB2 are correspondingly configured to receive the input signal "A1", the input signal "A2", the input signal "B1", and the input signal "B2" of the AOI gate. One of the terminal-conductors (i.e., ddA12$p$) is configured to carry the output signal "ZN" of the AOI gate.

In FIG. 9C, the circuit cell 900C includes vertical power rails 951C, 953C, 953C1, 955C. 957C. and 959C extending in the Y-direction in a first metal layer (e.g., a metal layer M0). Each of the vertical conducting lines is aligned with a vertical routing track. Two adjacent vertical routing tracks are separated by a pitch distance of 0.5 CPP. The circuit cell 900C also includes horizontal conducting lines 972C 974C1, 974C2, 976C1, 976C2, 976C3, 976C4, 978C1, 978C2, 978C3, 978C4, and 978C5 extending in the X-direction in a second metal layer (e.g., a metal layer M1).

Each of the source terminal sB1$p$ of the PMOS transistor TB1$p$ and the source terminal sB2$p$ of the PMOS transistor TB2$p$ is conductively connected to the horizontal conducting line 974C2 in the second metal layer through a corresponding vertical conducting line in the first metal layer. The horizontal conducting line 974C2 is further connected to the vertical power rail 957C which is configured to receive the upper power supply voltage VDD.

Each of the drain terminal dB1$p$ of the PMOS transistor TB1$p$ and the drain terminal dB2$p$ of the PMOS transistor TB2$p$ is conductively connected to the horizontal conducting line 972C in the second metal layer through a corresponding vertical conducting line in the first metal layer. Each of the source terminal sA2$p$ of the PMOS transistor TA2$p$ and the source terminal sA1$p$ of the PMOS transistor TA1$p$ are also conductively connected to the horizontal conducting line 972C through one of the corresponding vertical conducting lines 925C1 and 929C1. Each of the drain terminal dA1$p$ of the PMOS transistor TA1$p$ and the drain terminal dA2$p$ of the PMOS transistor TA2$p$ is conductively connected to the horizontal conducting line 974C1 in the second metal layer through a corresponding vertical conducting line in the first metal layer. The drain terminal dA1$p$ of the PMOS transistor TA1$p$ is further connected to the drain terminal dA1$n$ of the NMOS transistor TA1$n$ with a terminal connector ddA1$pn$. Each of the drain terminal dA1$n$ of the NMOS transistor TA1$n$ and the drain terminal dB1$n$ of the NMOS transistor TB1$n$ is conductively connected to the horizontal conducting line 978C3 in the second metal layer through a corresponding vertical conducting line in the first metal layer.

Each of the source terminal dA1$n$ of the NMOS transistor TA1$n$ and the drain terminal dA2$n$ of the NMOS transistor TA2$n$ is conductively connected to the horizontal conducting line 978C2 in the second metal layer through a corresponding vertical conducting line in the first metal layer. The source terminal sA2$n$ of the NMOS transistor TA2$n$ is conductively connected to the horizontal conducting line 978C1 in the second metal layer through a corresponding vertical conducting line in the first metal layer. The horizontal conducting line 978C1 is further connected to the vertical power rail 951C which is configured to receive the lower power supply voltage VSS.

Each of the source terminal dB1$n$ of the NMOS transistor TB1$n$ and the drain terminal dB2$n$ of the NMOS transistor TB2$n$ is conductively connected to the horizontal conducting line 978C4 in the second metal layer through a corresponding vertical conducting line in the first metal layer. The source terminal sB2$n$ of the NMOS transistor TB2$n$ is conductively connected to the horizontal conducting line 978C4 in the second metal layer through a corresponding vertical conducting line in the first metal layer. The horizontal conducting line 978C4 is further connected to the vertical power rail 959C which is configured to receive the lower power supply voltage VSS.

Each of the horizontal conducting lines 974C1, 974C2, 974C3, and 974C4 is correspondingly connected to one of the gate-conductors gA2, gA1, gB1, and gB2 through a vertical conducting line in the first metal layer. The horizontal conducting lines 974C1, 974C2, 974C3, and 974C4 are configured as the input pins of the AOI gate in the circuit cell 900C. The horizontal conducting line 974C1 is configured as an output pin of the AOI gate in the circuit cell 900C.

FIG. 10 is a flowchart of a method 1000 of manufacturing an integrated circuit having power stubs, in accordance with some embodiments. The sequence in which the operations of method 1000 are depicted in FIG. 10 is for illustration only; the operations of method 1000 are capable of being executed in sequences that differ from that depicted in FIG. 10. It is understood that additional operations may be performed before, during, and/or after the method 1000 depicted in FIG. 10, and that some other processes may only be briefly described herein.

In operation 1010 of method 1000, a first-type active-region structure and a second-type active-region structure extending in the X-direction direction are fabricated. In some embodiments, the first-type active-region structure is a p-type active-region structure, and the second-type active-region structure is an n-type active-region structure. In some embodiments, the first-type active-region structure is an n-type active-region structure, and the second-type active-region structure is a p-type active-region structure. In the example embodiments of FIGS. 1D-1G and FIGS. 5D-5H, the p-type active-region semiconductor structure 50$p$ and the n-type active-region semiconductor structure 50$n$ are fabricated.

In operation 1020 of method 1000, isolation regions in the first-type active-region structure and the second-type active-region structure are formed. In the example embodiments of FIGS. 1D-1G and FIGS. 5D-5H, isolation regions i101$p$ and i109$p$ are fabricated in the p-type active-region semiconductor structure 50$p$, and isolation regions i101$n$ and i109$n$ are fabricated in the n-type active-region semiconductor structure 50$n$.

In operation 1030 of method 1000, terminal-conductors extending the Y-direction are fabricated. In the example embodiments of FIGS. 1D-1G and FIGS. 5D-5H, terminal-conductors sTp, sTn, and dTpn are fabricated. The terminal-conductors sTp is the source terminal of the PMOS transistor Tp, and the terminal-conductors sTn is the source terminal of the NMOS transistor Tn.

In operation 1040 of method 1000, a first interlayer dielectric is deposited, and the first interlayer dielectric covers the first-type active-region structure and the second-type active-region structure. In the example embodiments of FIGS. 1D-1G and FIGS. 5D-5H, the first interlayer dielectric ILD0 is deposited. The first interlayer dielectric ILD0 covers the PMOS active-region structure 50$p$ and the NMOS active-region structure 50$n$.

In operation 1050 of method 1000, a first power stub and a second power stub in a first metal layer overlying the first interlayer dielectric are fabricated. In the example embodiments of FIGS. 1D-1G, each of the horizontal conducting lines 124A and 128A overlying the first interlayer dielectric ILD0 is fabricated as a power stub. In the example embodiments of FIGS. 5D-5H, each of the vertical conducting lines 524A1 and 524A2 overlying the first interlayer dielectric ILD0 is fabricated as a power stub.

In operation 1060 of method 1000, a second interlayer dielectric is deposited, and the second interlayer dielectric covers the first power stub and the second power stub. In the example embodiments of FIGS. 1D-1G and FIGS. 5D-5H, the second interlayer dielectric ILD1 is deposited.

In operation 1070 of method 1000, a first power line and a second power line in a second metal layer overlying the second interlayer dielectric are fabricated. In the example embodiments of FIGS. 1D-1G, each of the vertical conducting lines 172A1 and 174A2 overlying the second interlayer dielectric ILD1 is fabricated as a power line. In the example embodiments of FIGS. 5D-5H, each of the power rail 571 and the power rail 579 overlying the second interlayer dielectric ILD1 is fabricated as a power line.

Figure 11:
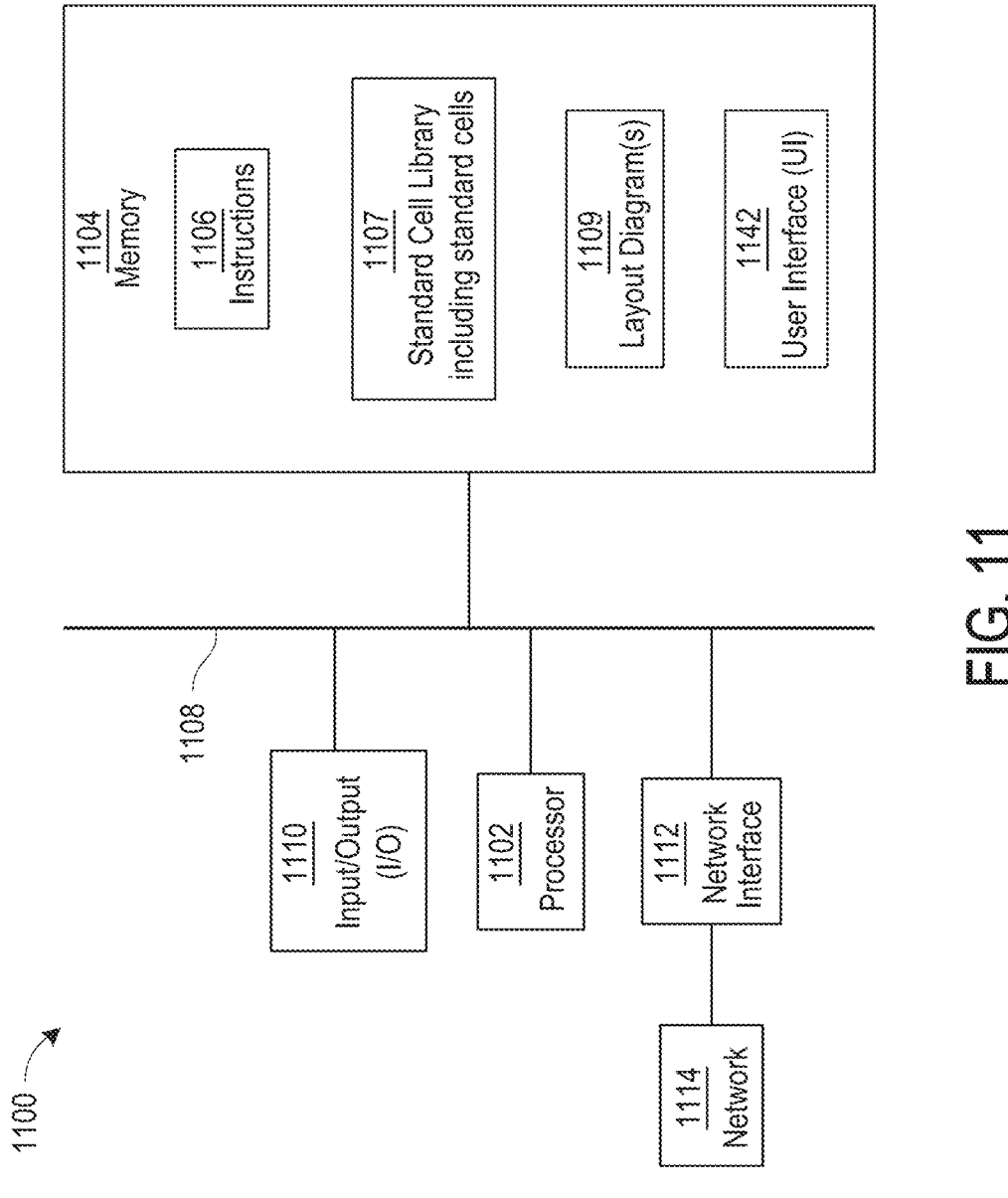
FIG. 11 is a block diagram of an electronic design automation (EDA) system in accordance with some embodiments.

FIG. 11 is a block diagram of an electronic design automation (EDA) system 1100 in accordance with some embodiments.

In some embodiments, EDA system 1100 includes an automatic placement and routing (APR) system. Methods described herein of designing layout diagrams represent wire routing arrangements, in accordance with one or more embodiments, are implementable, for example, using EDA system 1100, in accordance with some embodiments.

In some embodiments, EDA system 1100 is a general purpose computing device including a hardware processor 1102 and a non-transitory, computer-readable storage medium 1104. Storage medium 1104, amongst other things, is encoded with, i.e., stores, computer program code 1106, i.e., a set of executable instructions. Execution of instructions 1106 by hardware processor 1102 represents (at least in part) an EDA tool which implements a portion or all of the methods described herein in accordance with one or more embodiments (hereinafter, the noted processes and/or methods).

Processor 1102 is electrically coupled to computer-readable storage medium 1104 via a bus 1108. Processor 1102 is also electrically coupled to an I/O interface 1110 by bus 1108. A network interface 1112 is also electrically connected to processor 1102 via bus 1108. Network interface 1112 is connected to a network 1114, so that processor 1102 and computer-readable storage medium 1104 are capable of connecting to external elements via network 1114. Processor 1102 is configured to execute computer program code 1106 encoded in computer-readable storage medium 1104 in order to cause system 1100 to be usable for performing a portion or all of the noted processes and/or methods. In one or more embodiments, processor 1102 is a central processing unit (CPU), a multi-processor, a distributed processing system, an application specific integrated circuit (ASIC), and/or a suitable processing unit.

In one or more embodiments, computer-readable storage medium 1104 is an electronic, magnetic, optical, electromagnetic, infrared, and/or a semiconductor system (or apparatus or device). For example, computer-readable storage medium 1104 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1104 includes a compact disk-read only memory (CD-ROM), a compact disk-read/write (CD-R/W), and/or a digital video disc (DVD).

In one or more embodiments, storage medium 1104 stores computer program code 1106 configured to cause system 1100 (where such execution represents (at least in part) the EDA tool) to be usable for performing a portion or all of the noted processes and/or methods. In one or more embodiments, storage medium 1104 also stores information which facilitates performing a portion or all of the noted processes and/or methods. In one or more embodiments, storage medium 1104 stores library 1107 of standard cells including such standard cells as disclosed herein. In one or more embodiments, storage medium 1104 stores one or more layout diagrams 1109 corresponding to one or more layouts disclosed herein.

EDA system 1100 includes I/O interface 1110. I/O interface 1110 is coupled to external circuitry. In one or more embodiments, I/O interface 1110 includes a keyboard, keypad, mouse, trackball, trackpad, touchscreen, and/or cursor direction keys for communicating information and commands to processor 1102.

EDA system 1100 also includes network interface 1112 coupled to processor 1102. Network interface 1112 allows system 1100 to communicate with network 1114, to which one or more other computer systems are connected. Network interface 1112 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1100.

System 1100 is configured to receive information through I/O interface 1110. The information received through I/O interface 1110 includes one or more of instructions, data, design rules, libraries of standard cells, and/or other parameters for processing by processor 1102. The information is transferred to processor 1102 via bus 1108. EDA system 1100 is configured to receive information related to a user interface (UI) through I/O interface 1110. The information is stored in computer-readable medium 1104 as UI 1142.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1100. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 12:
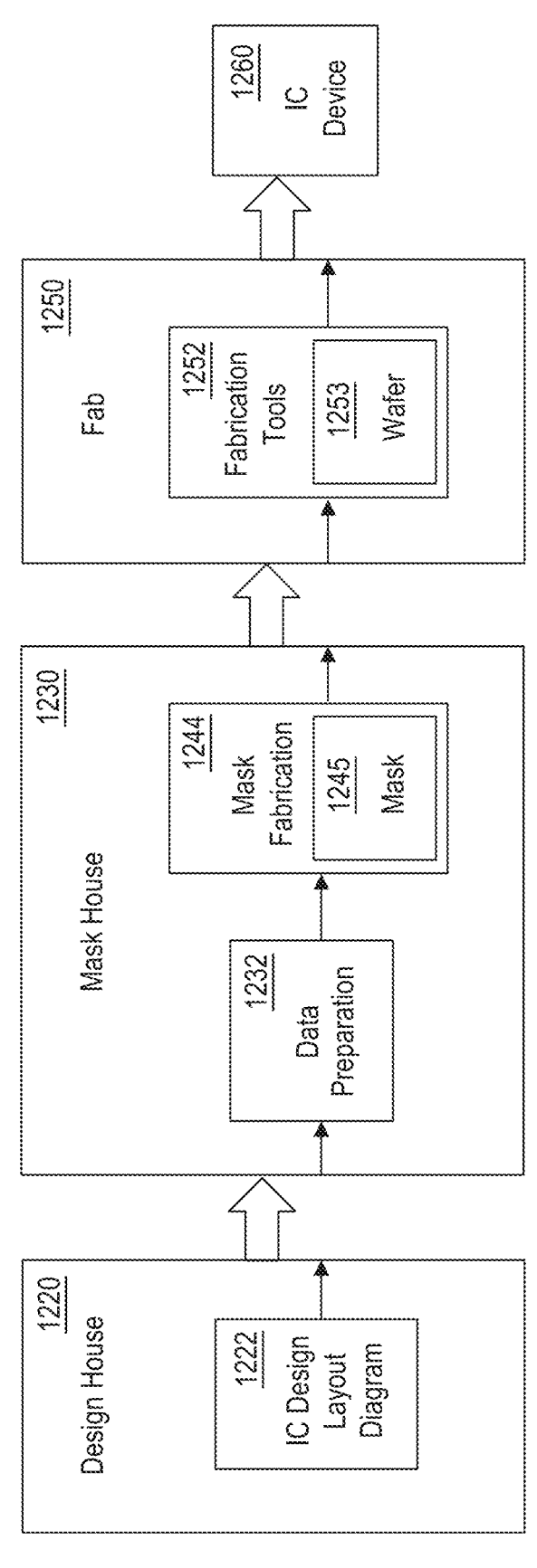
FIG. 12 is a block diagram of an integrated circuit (IC) manufacturing system, and an IC manufacturing flow associated therewith, in accordance with some embodiments.

FIG. 12 is a block diagram of an integrated circuit (IC) manufacturing system 1200, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1200.

In FIG. 12, IC manufacturing system 1200 includes entities, such as a design house 1220, a mask house 1230, and an IC manufacturer/fabricator (fab) 1250, that interact with one another in the design, development, and manufacturing cycles and/or services related to manufacturing an IC device 1260. The entities in system 1200 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1220, mask house 1230, and IC fab 1250 is owned by a single larger company. In some embodiments, two or more of design house 1220, mask house 1230, and IC fab 1250 coexist in a common facility and use common resources.

Design house (or design team) 1220 generates an IC design layout diagram 1222. IC design layout diagram 1222 includes various geometrical patterns designed for an IC device 1260. The geometrical patterns correspond to patterns of metal, oxide, or semiconductor layers that make up the various components of IC device 1260 to be fabricated. The various layers combine to form various IC features. For example, a portion of IC design layout diagram 1222 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1220 implements a proper design procedure to form IC design layout diagram 1222. The design procedure includes one or more of logic design, physical design or place and route. IC design layout diagram 1222 is presented in one or more data files having information of the geometrical patterns. For example, IC design layout diagram 1222 can be expressed in a GDSII file format or DFII file format.

Mask house 1230 includes data preparation 1232 and mask fabrication 1244. Mask house 1230 uses IC design layout diagram 1222 to manufacture one or more masks 1245 to be used for fabricating the various layers of IC device 1260 according to IC design layout diagram 1222. Mask house 1230 performs mask data preparation 1232, where IC design layout diagram 1222 is translated into a representative data file (RDF). Mask data preparation 1232 provides the RDF to mask fabrication 1244. Mask fabrication 1244 includes a mask writer. A mask writer converts the RDF to an image on a substrate, such as a mask (reticle) 1245 or a semiconductor wafer 1253. The design layout diagram 1222 is manipulated by mask data preparation 1232 to comply with particular characteristics of the mask writer and/or requirements of IC fab 1250. In FIG. 12, mask data preparation 1232 and mask fabrication 1244 are illustrated as separate elements. In some embodiments, mask data preparation 1232 and mask fabrication 1244 can be collectively referred to as mask data preparation.

In some embodiments, mask data preparation 1232 includes optical proximity correction (OPC) which uses lithography enhancement techniques to compensate for image errors, such as those that can arise from diffraction, interference, other process effects and the like. OPC adjusts IC design layout diagram 1222. In some embodiments, mask data preparation 1232 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1232 includes a mask rule checker (MRC) that checks the IC design layout diagram 1222 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1222 to compensate for photolithographic implementation effects during mask fabrication 1244, which may undo part of the modifications performed by OPC in order to meet mask creation rules.

In some embodiments, mask data preparation 1232 includes lithography process checking (LPC) that simulates processing that will be implemented by IC fab 1250 to fabricate IC device 1260. LPC simulates this processing based on IC design layout diagram 1222 to create a simulated manufactured device, such as IC device 1260. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1222.

It should be understood that the above description of mask data preparation 1232 has been simplified for the purposes of clarity. In some embodiments, data preparation 1232 includes additional features such as a logic operation (LOP) to modify the IC design layout diagram 1222 according to manufacturing rules. Additionally, the processes applied to IC design layout diagram 1222 during data preparation 1232 may be executed in a variety of different orders.

After mask data preparation 1232 and during mask fabrication 1244, a mask 1245 or a group of masks 1245 are fabricated based on the modified IC design layout diagram 1222. In some embodiments, mask fabrication 1244 includes performing one or more lithographic exposures based on IC design layout diagram 1222. In some embodiments, an electron-beam (e-beam) or a mechanism of multiple e-beams is used to form a pattern on a mask (photomask or reticle) 1245 based on the modified IC design layout diagram 1222. Mask 1245 can be formed in various technologies. In some embodiments, mask 1245 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1245 includes a transparent substrate (e.g., fused quartz) and an opaque material (e.g., chromium) coated in the opaque regions of the binary mask. In another example, mask 1245 is formed using a phase shift technology. In a phase shift mask (PSM) version of mask 1245, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1244 is used in a variety of processes. For example, such a mask(s) is used in an ion implantation process to form various doped regions in semiconductor wafer 1253, in an etching process to form various etching regions in semiconductor wafer 1253, and/or in other suitable processes.

IC fab 1250 is an IC fabrication business that includes one or more manufacturing facilities for the fabrication of a variety of different IC products. In some embodiments, IC Fab 1250 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1250 includes fabrication tools 1252 configured to execute various manufacturing operations on semiconductor wafer 1253 such that IC device 1260 is fabricated in accordance with the mask(s), e.g., mask 1245. In various embodiments, fabrication tools 1252 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1250 uses mask(s) 1245 fabricated by mask house 1230 to fabricate IC device 1260. Thus, IC fab 1250 at least indirectly uses IC design layout diagram 1222 to fabricate IC device 1260. In some embodiments, semiconductor wafer 1253 is fabricated by IC fab 1250 using mask(s) 1245 to form IC device 1260. In some embodiments, the IC fabrication includes performing one or more lithographic exposures based at least indirectly on IC design layout diagram 1222. Semiconductor wafer 1253 includes a silicon substrate or other proper substrate having material layers formed thereon. Semiconductor wafer 1253 further includes one or more of various doped regions, dielectric features, multi-level interconnects, and the like (formed at subsequent manufacturing steps).

An aspect of the present disclosure relates to an integrated circuit. The integrated circuit includes a first-type active-region structure and a second-type active-region structure extending in a first direction, a first isolation region and a second isolation region in the first-type active-region structure, and a third isolation region and a fourth isolation region in the second-type active-region structure. The third isolation region in the second-type active-region structure and the first isolation region in the first-type active-region structure are aligned vertically along a second direction and delineates a first vertical cell boundary of a circuit cell. The fourth isolation region in the second-type active-region structure and the second isolation region in the first-type active-region structure are aligned vertically along the second direction and delineates a second vertical cell boundary of the circuit cell. The integrated circuit also includes a first power stub and a second power stub in a first metal layer overlying a first interlayer dielectric that covers the first-type active-region structure and the second-type active-region structure. The integrated circuit still includes a first via connector directly connected between the first power stub and a first source terminal of a first transistor in the circuit cell, and a second via connector directly connected between the second power stub and a second source terminal of a second transistor in the circuit cell. The integrated circuit further includes a first power line and a second power line in a second metal layer overlying a second interlayer dielectric that covers the first power stub and the second power stub in the first metal layer. The first power line is connected to the first power stub and the second power line is connected to the second power stub. The first power line is configured to receive a first power supply voltage and the second power line is configured to receive a second power supply voltage that is different from the first power supply voltage.

Another aspect of the present disclosure also relates to an integrated circuit. The integrated circuit includes a first-type active-region structure and a second-type active-region structure extending in a first direction, a plurality of dummy-gate-conductors extending in a second direction that is perpendicular to the first direction, and a plurality of gate-conductors extending in the second direction. Each of the first-type active-region structure and the second-type active-region structure has isolation regions at intersections where the dummy-gate-conductors intersect the first-type active-region structure or the second-type active-region structure. A first dummy-gate-conductor is aligned with a first vertical cell boundary of a circuit cell and a second dummy-gate-conductor is aligned with a second vertical cell boundary of the circuit cell. Each of the gate-conductors intersects one or both of the first-type active-region structure and the first-type active-region structure. Each of the gate-conductors is between two adjacent dummy gate-conductors with an equal pitch distance. The integrated circuit also includes a first power stub and a second power stub extending in the second direction in a first metal layer overlying a first interlayer dielectric that covers the first-type active-region structure and the second-type active-region structure. The integrated circuit still includes a first via connector directly connected between the first power stub and a first source terminal of a first transistor in the circuit cell, and a second via connector directly connected between the second power stub and a second source terminal of a second transistor in the circuit cell. The integrated circuit further includes a first power line and a second power line extending in the first direction in a second metal layer overlying a second interlayer dielectric that covers the first power stub and the second power stub in the first metal layer. The first power line is connected to the first power stub and the second power line is connected to the second power stub. The first power line is configured to receive a first power supply voltage and the second power line is configured to receive a second power supply voltage that is different from the first power supply voltage.

Another aspect of the present disclosure relates to a method of fabricating an integrated circuit. The method includes fabricating a first-type active-region structure and a second-type active-region structure extending in a first direction, forming a first isolation region and a second isolation region in the first-type active-region structure, and forming a third isolation region and a fourth isolation region in the second-type active-region structure. The third isolation region in the second-type active-region structure and the first isolation region in the first-type active-region structure are aligned vertically along a second direction and delineates a first vertical cell boundary of a circuit cell. The fourth isolation region in the second-type active-region structure and the second isolation region in the first-type active-region structure are aligned vertically along the second direction and delineates a second vertical cell boundary of the circuit cell. The method also includes fabricating a first power stub and a second power stub in a first metal layer overlying a first interlayer dielectric that covers the first-type active-region structure and the second-type active-region structure. The method still includes connecting the first power stub to a first source region which is between the first isolation region and the second isolation region, and connecting the second power stub to a second source region which is between the third isolation region and the fourth isolation region. The method further includes fabricating a first power line and a second power line in a second metal layer overlying a second interlayer dielectric that covers the first power stub and the second power stub in the first metal layer. The first power line is configured to receive a first power supply voltage and the second power line is configured to receive a second power supply voltage that is different from the first power supply voltage. The method further includes connecting the first power stub with the first power line, and connecting the second power stub with the second power line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
a first-type active-region structure and a second-type active-region structure extending in a first direction;
a first isolation region and a second isolation region in the first-type active-region structure;

a third isolation region and a fourth isolation region in the second-type active-region structure, wherein the third isolation region in the second-type active-region structure and the first isolation region in the first-type active-region structure are aligned vertically along a second direction and delineates a first vertical cell boundary of a circuit cell, and wherein the fourth isolation region in the second-type active-region structure and the second isolation region in the first-type active-region structure are aligned vertically along the second direction and delineates a second vertical cell boundary of the circuit cell;

a first power stub and a second power stub in a first metal layer overlying a first interlayer dielectric that covers the first-type active-region structure and the second-type active-region structure, wherein each of the first power stub and the second power stub is bounded between the first vertical cell boundary and the second vertical cell boundary;

a first via connector directly connected between the first power stub and a first source terminal of a first transistor in the circuit cell;

a second via connector directly connected between the second power stub and a second source terminal of a second transistor in the circuit cell; and a first power line and a second power line in a second metal layer overlying a second interlayer dielectric that covers the first power stub and the second power stub in the first metal layer, wherein the first power line is connected to the first power stub and the second power line is connected to the second power stub, and wherein the first power line is configured to receive a first power supply voltage and the second power line is configured to receive a second power supply voltage that is different from the first power supply voltage.

2. The integrated circuit of claim 1, further comprising:
a first terminal-conductor extending in the second direction and intersecting the first-type active-region structure at a first source region which is between the first isolation region and the second isolation region, wherein the first terminal-conductor is the first source terminal of the first transistor; and a second terminal-conductor extending in the second direction and intersecting the second-type active-region structure at a second source region which is between the third isolation region and the fourth isolation region, wherein the second terminal-conductor is the second source terminal of the second transistor.

3. The integrated circuit of claim 2, further comprising:
a third via connector directly connected between the first power stub and the first power line; and a fourth via connector directly connected between the second power stub and the second power line.

4. The integrated circuit of claim 1, wherein each of the first power line and the second power line extends in the second direction.

5. The integrated circuit of claim 4, wherein each of the first power stub and the second power stub extends in the first direction while bounded between the first vertical cell boundary and the second vertical cell boundary.

6. The integrated circuit of claim 4, further comprising:
a horizontal conducting line extending in the first direction in the first metal layer and aligned with a horizontal routing track, wherein either the first power stub or the second power stub is aligned with the horizontal routing track that positions the horizontal conducting line.

7. The integrated circuit of claim 4, further comprising:

a vertical conducting line extending in the second direction in the second metal layer and aligned with a vertical routing track, wherein either the first power line or the second power line is aligned with the vertical routing track that positions the vertical conducting line.

8. The integrated circuit of claim 1, wherein each of the first power stub and the second power stub extends in the second direction, and wherein each of the first power line and the second power line extends in the first direction.

9. The integrated circuit of claim 8, further comprising:
a vertical conducting line extending in the second direction in the second metal layer and aligned with a vertical routing track, wherein either the first power stub or the second power stub is aligned with the vertical routing track that positions the vertical conducting line.

10. The integrated circuit of claim 8, wherein each of the first power line and the second power line is bounded between the first vertical cell boundary and the second vertical cell boundary.

11. The integrated circuit of claim 8, wherein at least one of the first power line or the second power line crosses both the first vertical cell boundary and the second vertical cell boundary.

12. An integrated circuit comprising:
a first-type active-region structure and a second-type active-region structure extending in a first direction;
a first isolation region and a second isolation region in the first-type active-region structure;
a third isolation region and a fourth isolation region in the second-type active-region structure, wherein the third isolation region in the second-type active-region structure and the first isolation region in the first-type active-region structure are aligned vertically along a second direction and delineates a first vertical cell boundary of a circuit cell, and wherein the fourth isolation region in the second-type active-region structure and the second isolation region in the first-type active-region structure are aligned vertically along the second direction and delineates a second vertical cell boundary of the circuit cell; and
a first power stub and a second power stub in a first metal layer overlying a first interlayer dielectric that covers the first-type active-region structure and the second-type active-region structure, wherein each of the first power stub and the second power stub is bounded between the first vertical cell boundary and the second vertical cell boundary while extending in the first direction, and wherein the first power stub is configured to receive a first power supply voltage and the second power stub is configured to receive a second power supply voltage that is different from the first power supply voltage.

13. The integrated circuit of claim 12, further comprising:
a first via connector directly connected between the first power stub and a first source terminal of a first transistor in the circuit cell;
a second via connector directly connected between the second power stub and a second source terminal of a second transistor in the circuit cell; and
a first power line and a second power line in a second metal layer overlying a second interlayer dielectric that covers the first power stub and the second power stub in the first metal layer, wherein the first power line is connected to the first power stub and the second power line is connected to the second power stub, and wherein each of the first power line and the second power line extends in the second direction.

14. The integrated circuit of claim 13, further comprising:

a first terminal-conductor extending in the second direction and intersecting the first-type active-region structure at a first source region which is between the first isolation region and the second isolation region, where the second direction is perpendicular to the first direction, wherein the first terminal-conductor is the first source terminal of the first transistor; and a second terminal-conductor extending in the second direction and intersecting the second-type active-region structure at a second source region which is between the third isolation region and the fourth isolation region, wherein the second terminal-conductor is the second source terminal of the second transistor.

15. The integrated circuit of claim 14, further comprising:

a third via connector directly connected between the first power stub and the first power line; and a fourth via connector directly connected between the second power stub and the second power line.

16. The integrated circuit of claim 12, further comprising:

a horizontal conducting line extending in the first direction in the first metal layer and aligned with a horizontal routing track, wherein either the first power stub or the second power stub is aligned with the horizontal routing track that positions the horizontal conducting line.

17. The integrated circuit of claim 13, further comprising:

a vertical conducting line extending in the second direction in the second metal layer and aligned with a vertical routing track, wherein either the first power line or the second power line is aligned with the vertical routing track that positions the vertical conducting line.

18. An integrated circuit comprising:

a first-type active-region structure and a second-type active-region structure extending in a first direction;

a first isolation region and a second isolation region in the first-type active-region structure;

a third isolation region and a fourth isolation region in the second-type active-region structure, wherein the third isolation region in the second-type active-region structure and the first isolation region in the first-type active-region structure are aligned vertically along a second direction and delineates a first vertical cell boundary of a circuit cell, and wherein the fourth isolation region in the second-type active-region structure and the second isolation region in the first-type active-region structure are aligned vertically along the second direction and delineates a second vertical cell boundary of the circuit cell;

a first power stub and a second power stub in a first metal layer overlying a first interlayer dielectric that covers the first-type active-region structure and the second-type active-region structure, wherein each of the first power stub and the second power stub is bounded between the first vertical cell boundary and the second vertical cell boundary while extending in the first direction;

a first via connector directly connected between the first power stub and a first source terminal of a first transistor in the circuit cell; and a second via connector directly connected between the second power stub and a second source terminal of a second transistor in the circuit cell.

19. The integrated circuit of claim 18, further comprising:

a first power line and a second power line in a second metal layer overlying a second interlayer dielectric that covers the first power stub and the second power stub in the first metal layer, wherein the first power line is connected to the first power stub and the second power line is connected to the second power stub, wherein each of the first power line and the second power line extends in the second direction, and wherein the first power line is configured to receive a first power supply voltage and the second power line is configured to receive a second power supply voltage that is different from the first power supply voltage.

20. The integrated circuit of claim 18, further comprising:

a first terminal-conductor extending in the second direction and intersecting the first-type active-region structure at a first source region which is between the first isolation region and the second isolation region, wherein the first terminal-conductor is the first source terminal of the first transistor; and a second terminal-conductor extending in the second direction and intersecting the second-type active-region structure at a second source region which is between the third isolation region and the fourth isolation region, wherein the second terminal-conductor is the second source terminal of the second transistor.

* * * * *